(12) United States Patent
Noh et al.

(10) Patent No.: US 8,445,367 B2
(45) Date of Patent: May 21, 2013

(54) METHODS OF MANUFACTURING SEMICONDUCTOR DEVICES

(75) Inventors: Jin-Tae Noh, Suwon-si (KR);
Hun-Hyeong Lim, Hwaseong-si (KR);
Ki-Hyun Hwang, Seongnam-si (KR);
Jin-Gyun Kim, Yongin-si (KR);
Sang-Ryol Yang, Hwaseong-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 13/287,509

(22) Filed: Nov. 2, 2011

(65) Prior Publication Data
US 2012/0115293 A1 May 10, 2012

(30) Foreign Application Priority Data

Nov. 8, 2010 (KR) .................. 10-2010-0110209

(51) Int. Cl.
*H01L 21/20* (2006.01)
*H01L 21/36* (2006.01)

(52) U.S. Cl.
USPC ............... 438/505; 257/E21.09; 257/E21.17; 257/E21.269; 257/E21.274; 257/E21.478; 438/129; 438/244; 438/253; 438/387; 438/396

(58) Field of Classification Search
USPC ....... 257/E21.09, E21.17, E21.269, E21.274, 257/E21.478; 438/239, 244, 253, 387, 396, 438/492, 495, 503, 505, 637

See application file for complete search history.

(56) References Cited

U.S. PATENT DOCUMENTS

| 6,153,261 | A | 11/2000 | Xia et al. | |
|---|---|---|---|---|
| 6,762,110 | B1* | 7/2004 | Masuda ..................... | 438/396 |
| 6,806,175 | B2 | 10/2004 | Moore | |
| 7,001,844 | B2 | 2/2006 | Chakravarti et al. | |
| 2005/0066892 | A1 | 3/2005 | Dip et al. | |
| 2010/0311232 | A1* | 12/2010 | Hwang ..................... | 438/591 |
| 2011/0068398 | A1* | 3/2011 | Anderson et al. ............ | 257/347 |
| 2011/0175140 | A1* | 7/2011 | Taylor et al. ................ | 257/190 |
| 2011/0198758 | A1* | 8/2011 | Jeon et al. .................. | 257/774 |

* cited by examiner

*Primary Examiner* — Asok K Sarkar
(74) *Attorney, Agent, or Firm* — F. Chau & Associates, LLC

(57) ABSTRACT

In a method of manufacturing a semiconductor device, a plurality of sacrificial layers and a plurality of insulating interlayers are repeatedly and alternately on a substrate. The insulating interlayers include a different material from a material of the sacrificial layers. At least one opening through the insulating interlayers and the sacrificial layers are formed. The at least one opening exposes the substrate. The seed layer is formed on an inner wall of the at least one opening using a first silicon source gas. A polysilicon channel is formed in the at least one opening by growing the seed layer. The sacrificial layers are removed to form a plurality of grooves between the insulating interlayers. A plurality of gate structures is formed in the grooves, respectively.

20 Claims, 20 Drawing Sheets

METHODS OF MANUFACTURING SEMICONDUCTOR DEVICES

CROSS-REFERENCE TO RELATED APPLICATIONS

This application claims priority under 35 USC§119 to Korean Patent Application No. 10-2010-0110209 filed on Nov. 8, 2010, the disclosure of which is hereby incorporated by reference herein in it's entirety.

BACKGROUND

1. Technical Field

Example embodiments relate to methods of manufacturing semiconductor devices. More particularly, example embodiments relate to methods of manufacturing semiconductor devices including a silicon layer.

2. Description of the Related Art

Recently, to improve the integration degree of memory devices, methods of forming a plurality of transistors stacked in a vertical direction relative to a substrate have been developed. In these methods, a semiconductor pattern is formed in a vertical direction relative to the substrate to define an active region.

To form the semiconductor pattern, sacrificial layer patterns and insulating interlayer patterns are alternately and repeatedly stacked, and a silicon layer is formed on sidewalls of the sacrificial layer patterns and the insulating interlayer patterns. However, the silicon layer having a thin thickness may not be uniformly formed when the sacrificial layer patterns and the insulating interlayer patterns include different materials from each other.

SUMMARY

Example embodiments provide a method of manufacturing a semiconductor device having a high reliability and integration degree.

According to example embodiments, there is provided a method of manufacturing a semiconductor device. In the method, sacrificial layers and insulating interlayers are formed repeatedly and alternately on a substrate. The insulating interlayers include a different material from a material of the sacrificial layers. At least one opening is formed through the insulating interlayers and the sacrificial layers. The at least one opening exposes the substrate. A seed layer is formed on an inner wall of the at least one opening using a first silicon source gas. A polysilicon channel is formed in the at least one opening by growing the seed layer. The sacrificial layers are removed to form a plurality of grooves between the insulating interlayers. A plurality of gate structures are formed in the grooves, respectively.

In example embodiments, the first silicon source gas may have a molecular weight equal to or more than about 65 g/mol.

In example embodiments, the first silicon source gas may include hexachlorodisilane (HCD), Bis(ethlymethylamino) silane (BEMAS), Bis(diethylamino)silane (BDEAS), Bis(dimethylamino)silane (BDMAS), tris(dimethylamino)silane (Tris-DMAS), tetrakis(dimethylamino)silane (TDMAS), tris(ethlymethylamino)silane (Tris-EMAS), Diethyl aminosiliane (DEAS), Bis(tertybutylamino)silane (BTBAS) or Di-Isopropyl-Amino-Silane (DIPAS). These may be used alone or in a mixture therof.

In example embodiments, the polysilicon channel may be formed by exposing the seed layer to a second silicon source gas.

In example embodiments, exposing the seed layer to the second silicon source gas and forming the seed layer may be performed in-situ in the same chamber In example embodiments, the second silicon source gas may include $SiH_4$, $Si_2H_6$, $Si_3H_8$ or $SiCl_2H_2$. These may be used alone or in a mixture thereof.

In example embodiments, an impurity source gas may be further provided when the seed layer is formed.

In example embodiments, the impurity source gas may include $PH_3$, $B_2H_6$, $BCl_3$, $NH_3$, $AsH_3$ or $BF_4$. These may be used alone or in a mixture thereof.

In example embodiments, the polysilicon channel may have a thickness less than about 300 Å.

In example embodiments, the sacrificial layers may be formed using silicon nitride and the insulating interlayers may be formed using silicon oxide In example embodiments, for forming the gate structures, a tunnel insulation layer, a charge trapping layer and a blocking layer may be formed sequentially on outer sidewalls of the polysilicon channel exposed by the grooves and surfaces of the insulating interlayers. A conductive layer may be formed on the blocking layer to fill the grooves. The conductive layer may be partially removed to form gate electrodes in the grooves.

In example embodiments, an insulation layer pattern may be further formed to fill a remaining portion of the opening after forming the polysilicon channel.

According to example embodiments, there is provided a method of a semiconductor device. In the method, a transistor is formed on a substrate. The transistor includes a gate structure and source/drain regions. An insulating interlayer is formed on the substrate to cover the transistor. A plurality of holes exposing the source/drain regions are formed through the insulating interlayer. A seed layer is formed on inner walls and bottoms of the holes using a first silicon source gas and an impurity source gas. Polysilicon plugs that fill the holes are formed by growing the seed layer using a second silicon source gas. A plurality of capacitors are formed to be electrically connected to the plugs.

In example embodiments, the first silicon source gas may include hexachlorodisilane (HCD), Bis(ethlymethylamino) silane (BEMAS), Bis(diethylamino)silane (BDEAS), Bis(dimethylamino)silane (BDMAS), tris(dimethylamino)silane (Tris-DMAS), tetrakis(dimethylamino)silane (TDMAS), tris(ethlymethylamino)silane (Tris-EMAS), Diethylaminosiliane (DEAS), Bis(tertybutylamino)silane (BTBAS) or Di-Isopropyl-Amino-Silane (DIPAS). These may be used alone or in a mixture therof.

In example embodiments, the second silicon source gas may include $SiH_4$, $Si_2H_6$, $Si_3H_8$ or $SiCl_2H_2$. These may be used alone or in a mixture thereof.

According to example embodiments, there is provided a method of a semiconductor device is provided. The method includes forming a pad insulation layer on a substrate, forming a plurality of sacrificial layers and a plurality of insulating interlayers repeatedly and alternately on the pad insulation layer and the etching selectivity between the insulating interlayers and the sacrificial layers is no less than about 1:80, partially and sequentially removing the insulating interlayer, the sacrificial layers and the pad insulation layer to form a first opening that exposes a top surface of the substrate, forming a seed layer on an inner sidewall and a bottom of the first opening using a first silicon source gas and growing the seed layer using a second silicon source gas to thereby form a polysilicon layer, the first silicon source gas having a larger molecular weight than a molecular weight of the second silicon source gas, forming a semiconductor pattern formed of the polysilicon layer on the inner sidewall and the bottom of the first opening and a first insulation layer pattern in the first opening and on the polysilicon layer, and partially etching the sacrificial layer and the insulating interlayer between the semiconductor pattern to form a plurality of sacrificial layer patterns and a plurality of insulating interlayer patterns and a second opening exposing a top surface of the substrate.

The method further includes removing the sacrificial layer patterns exposed by the second opening, thereby leaving the insulating interlayer patterns remaining on an outer sidewall of the semiconductor pattern spaced apart from one another by a groove formed between each of the spaced apart insulating interlayer patterns, sequentially forming a tunnel insulation layer, a charge trapping layer and a blocking layer on the outer sidewall of the semiconductor pattern exposed by the second opening and surfaces of the insulating interlayer patterns, forming a conductive layer on the blocking layer to fill the grooves, removing a portion of the conductive layer in the second opening such that the conductive layer only remains in the grooves to thereby form a control gate in each of the grooves between the insulating interlayer patterns and removing a portion of the tunnel insulation layer, charge trapping layer and the blocking on a bottom of the second opening to expose an upper surface of the substrate, forming an impurity region in the exposed upper surface of the substrate, forming a second insulation layer pattern in the second opening, forming an upper insulating interlayer on the semiconductor pattern, the first insulation layer pattern, the second insulation layer pattern an uppermost one of the insulating interlayer patterns; and forming a bit line which is electrically connected to the semiconductor pattern.

According to example embodiments, a polysilicon layer having a thin thickness and a uniform morphology may be formed using a first silicon source gas having a relatively high molecular weight and a second silicon source gas having a relatively low molecular weight in a hybrid-type. The polysilicon layer may serve as a channel region of a vertical semiconductor device. Further, the polysilicon layer may be provided on layers having different material from each other in semiconductor devices.

BRIEF DESCRIPTION OF THE DRAWINGS

Example embodiments of the present invention can more clearly understood from the following detailed description taken in conjunction with the accompanying drawings.

FIG. 1 is a circuit diagram illustrating a vertical semiconductor device in accordance with an example embodiment;

FIG. 2 is a cross-sectional view illustrating a vertical semiconductor device in accordance with an example embodiment;

FIG. 3 is a perspective view illustrating the vertical semiconductor device of FIG. 2;

FIGS. 4 to 12 are cross-sectional views illustrating a method of manufacturing the vertical semiconductor device of FIGS. 2 and 3;

FIG. 13 is a cross-sectional view illustrating a vertical semiconductor device in accordance with an example embodiment;

FIG. 14 is a perspective view illustrating the vertical semiconductor device of FIG. 13;

FIGS. 15 to 21 are cross-sectional views illustrating a method of manufacturing the vertical semiconductor device of FIGS. 13 and 14;

DETAILED DESCRIPTION OF THE EMBODIMENTS

Figure 1:
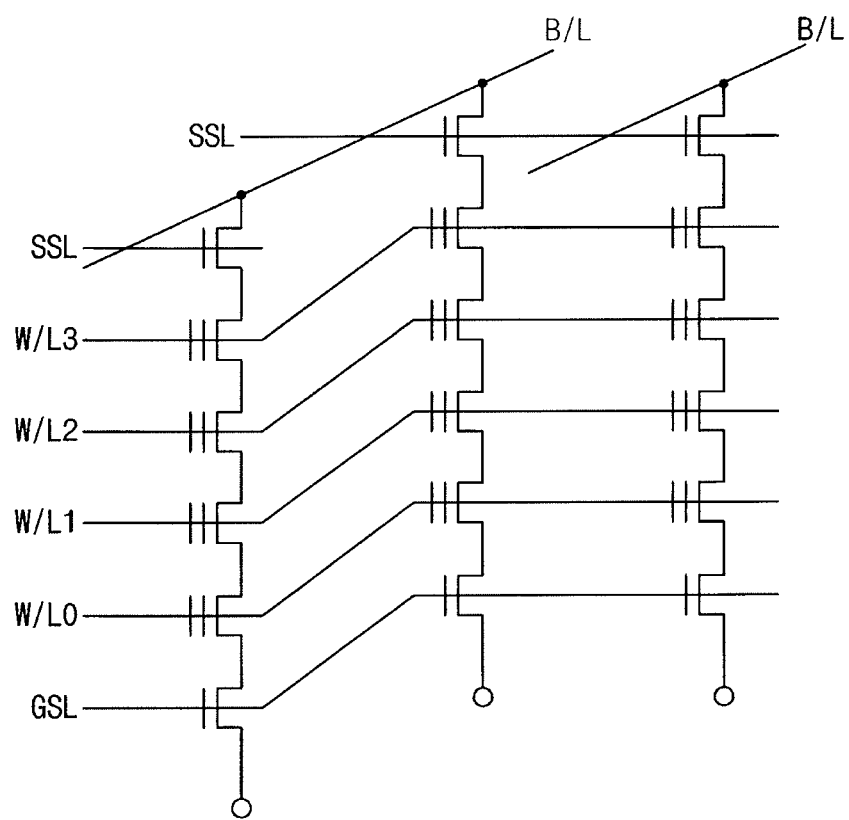
FIGS. 1 to 18 represent non-limiting, example embodiments as described herein.

Various example embodiments will be described more fully hereinafter with reference to the accompanying drawings, in which some example embodiments are shown. Example embodiments of the present inventive concept may, however, be embodied in many different forms and should not be construed as limited to example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. Like numerals refer to like elements throughout. As used herein, the term "and/or" includes any and all combinations of one or more of the associated listed items.

Hereinafter, example embodiments will be explained in detail with reference to the accompanying drawings.

FIG. 1 is a circuit diagram illustrating a vertical semiconductor device in accordance with an example embodiment.

Referring to FIG. 1, a vertical semiconductor device 10 may include, for example, a plurality of strings each of which may have a plurality of memory cells stacked in a vertical direction relative to a substrate (not shown). Each of the strings may include, for example, cell transistors and selection transistors connected in series to one another.

Each of the cell transistors may include, for example, a tunnel insulation layer, a charge trapping layer pattern, a blocking layer pattern and a control gate electrode. The control gate electrodes of the cell transistors may serve as, for example, word lines W/L0 to W/L3. The cell transistors may be, for example, connected in series to one another in the vertical direction. A ground selection transistor (GST) and a string selection transistor (SST) may be formed at both ends of each string, respectively. A control gate electrode of the GST may serve as a ground selection line (GSL), and a control gate electrode of the SST may serve as a string selection line (SSL). Each string may include, for example, a plurality of GSTs and a plurality of SSTs connected in series. Additionally, a common source line (CSL) may be connected to the GST.

The word lines at the same level may be electrically connected to each other.

Figure 2:
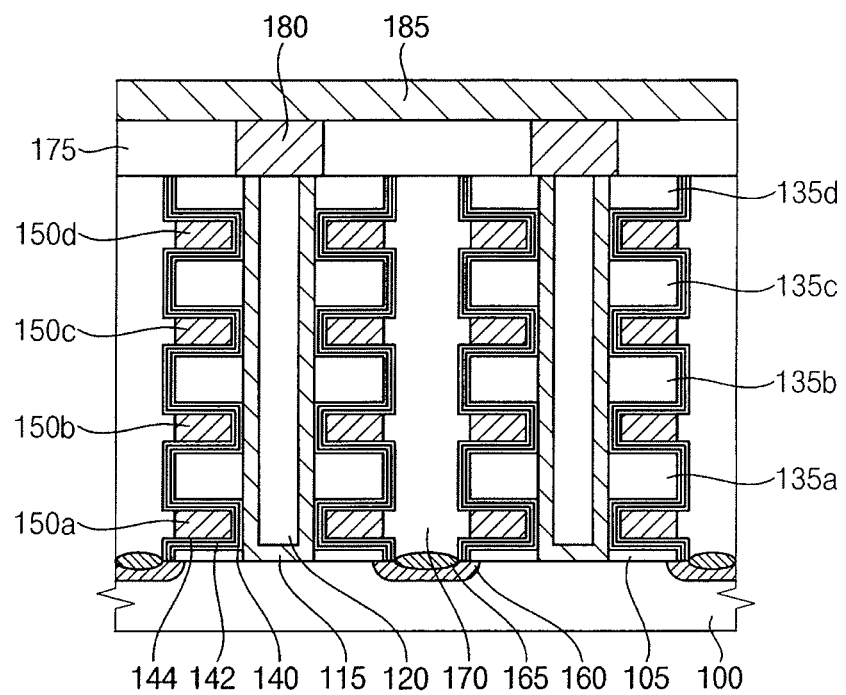
Figure 3:
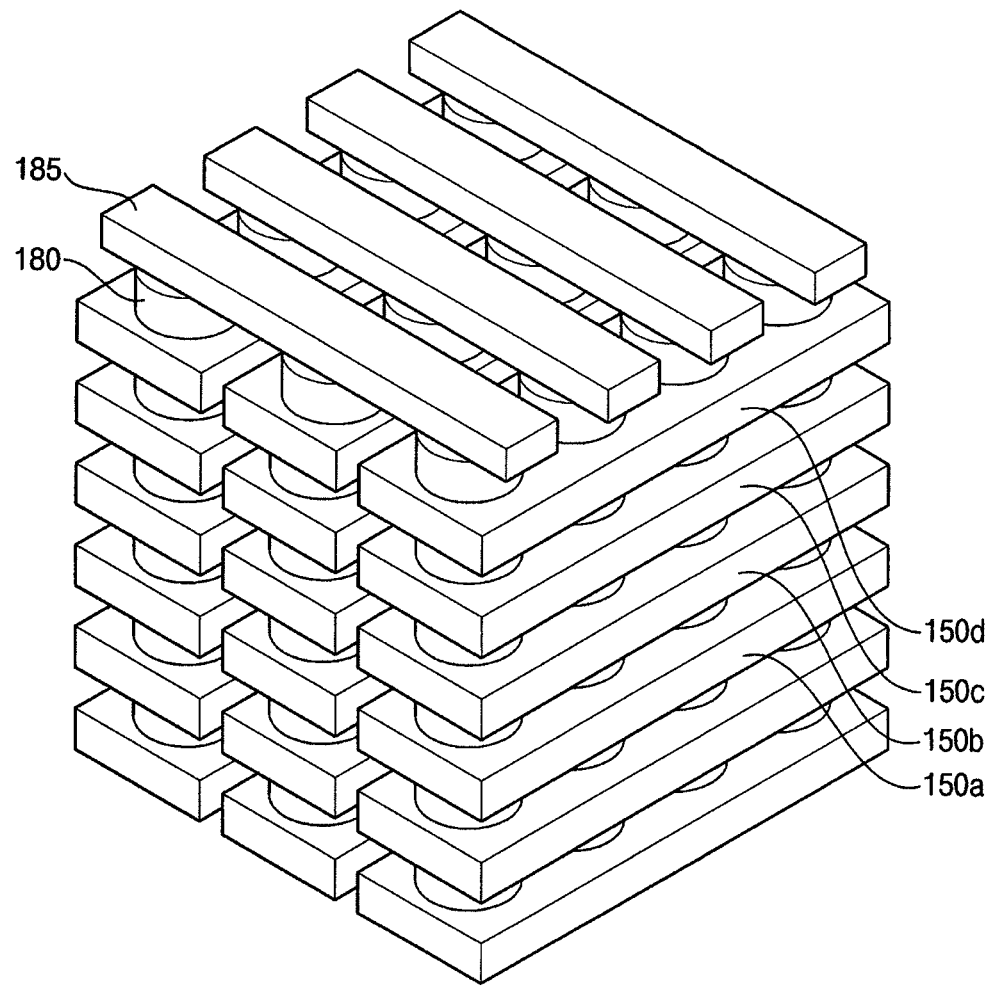
Figure 3:
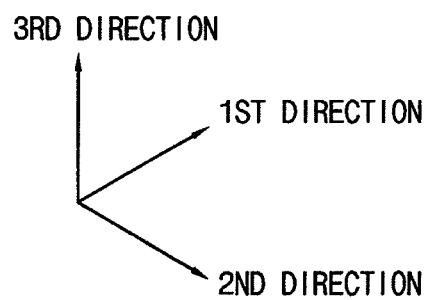

The circuit illustrated in FIG. 1 may be realized as shown in FIGS. 2 and 3. Hereinafter, a first direction may refer to a direction in which the word line extends, and a second direction may refer to a direction in which a bit line extends throughout the drawings. A third direction may refer to a direction that is vertical to a top surface of the substrate.

FIG. 2 is a cross-sectional view illustrating a vertical semiconductor device in accordance with an example embodiment. FIG. 3 is a perspective view illustrating the vertical semiconductor device of FIG. 2.

In some example embodiments, a string may include, for example, a GST, an SST and 2 cell transistors therebetween. However, the string may include, for example, more GSTs, SSTs and/or cell transistors.

Referring to FIG. 2, a semiconductor pattern 115 may be disposed on a substrate 100. The semiconductor pattern 115 may include, for example, single crystalline silicon or polysilicon. In example embodiments, a plurality of semiconductor patterns 115 may be arranged on the substrate 100 in both of the first direction and the second direction. A pad insulation layer 105 may also be formed on the substrate 100 as will be described in more detail in connection with the methods illustrated in FIGS. 4-12.

The semiconductor pattern 115 may have, for example, a hollow cylindrical shape or a cup shape in which a bottom thereof makes contact with a top surface of the substrate 100 and a sidewall extends in the third direction. In this case, the thickness of the sidewall of the semiconductor pattern 115 serving as a channel region may be decreased so that the operation speed of transistors including the channel region may be increased. The semiconductor pattern 115 may be doped with, for example, n-type or p-type impurities. A first insulation layer pattern 120 may fill an inner space defined by the bottom and the sidewall of the semiconductor pattern 115.

A string may include, for example, a plurality of cell transistors on the sidewall of the semiconductor pattern 115. The cell transistors may be, for example, connected in series to one another in the third direction. A GST and an SST may be disposed at both ends of the string. For example, a lowermost transistor may serve as the GST and an uppermost transistor may serve as the SST. In example embodiments, the GST and the SST may have a structure substantially the same as or similar to that of the cell transistors.

Insulating interlayer patterns 135a, 135b, 135c and 135d may contact an outer sidewall of the semiconductor pattern 115. The insulating interlayer patterns 135a, 135b, 135c and 135d may be, for example, disposed to be parallel to one another and protrude from the outer sidewall of the semiconductor pattern 115. The insulating interlayer patterns 135a, 135b, 135c and 135d may have, for example, a linear shape extending in the first direction. Additionally, the insulating interlayer patterns 135a, 135b, 135c and 135d may be, for example, spaced apart from one another in the third direction. Thus, a plurality of grooves exposing the outer sidewall of the semiconductor pattern 115 may be formed between the insulating interlayer patterns 135a, 135b, 135c and 135d, and the transistors may be formed in the grooves, respectively. The insulating interlayer patterns 135a, 135b, 135c and 135d may insulate the control gate electrodes 150a, 150b, 150c and 150d in different levels from one another.

A tunnel insulation layer 140 may be formed on the outer sidewall of the semiconductor pattern 115 and surfaces of the insulating interlayer patterns 135a, 135b, 135c and 135d. In some example embodiments, as illustrated in FIG. 2, the tunnel insulation layer 140 may be formed, for example, continuously on the outer sidewall of the semiconductor pattern 115 and the surfaces of the insulating interlayer patterns 135a, 135b, 135c and 135d throughout all levels of the vertically stacked structure. Alternatively, the tunnel insulation layer 140 may be separated from each other at a plurality of levels.

A charge trapping layer 142 may be formed on the tunnel insulation layer 140. The charge trapping layer 142 may include, for example, silicon nitride or a metal oxide in which electrons may be trapped. Like the tunnel insulation layer 140, the charge trapping layer 142 may be &limed continuously throughout all levels or separated from each other at a plurality of levels.

A blocking layer 144 may be formed on the charge trapping layer 142. The blocking layer 144 may include, for example, silicon oxide or a metal oxide. The metal oxide may include, for example, aluminum oxide.

Control gate electrodes 150a, 150b, 150c and 150d may be disposed on the blocking layer 144. The control gate electrodes 150a, 150b, 150c and 150d may be separated from one another at a plurality of levels. The control gate electrodes 150a, 150b, 150c and 150d may serve as, for example, word lines. The control gate electrodes 150a, 150b, 150c and 150d at the same level may be electrically connected to each other by a contact plug (not illustrated).

The control gate electrodes 150a, 150b, 150c and 150d may fill remaining portions of the grooves and have, for example, a linear shape extending in the first direction. The control gate electrodes 150a, 150b, 150c and 150d may at least partially surround the semiconductor pattern 115. The control gate electrodes 150a, 150b, 150c and 150d disposed at different levels may not be electrically connected to each other. The control gate electrodes 150a, 150b, 150c and 150d may include a metal having a low resistance, and thus the control gate electrodes 150a, 150b, 150c and 150d may have a reduced thickness. Accordingly, the vertical semiconductor device may have a relatively small height.

A second insulation layer pattern 170 may be disposed in a gap between adjacent multi-stacked structure including the control gate electrodes 150a, 150b, 150c and 150d and the insulating interlayer patterns 135a, 135b, 135c and 135d. The second insulation layer pattern 170 may have, for example, a linear shape extending in the first direction.

An impurity region 160 may be formed at an upper portion of the substrate 100 under the second insulation layer pattern 170. The impurity region 160 may serve as, for example, a common source line (CSL). A metal silicide pattern 165 may be further formed on the impurity region 160.

An upper insulating interlayer 175 may be formed on the semiconductor pattern 115, the first insulation layer pattern 120, the second insulation layer pattern 170 and an uppermost insulating interlayer pattern 135d. A bit line contact 180 may be formed through the upper insulating interlayer 175 to be electrically connected to the semiconductor pattern 115. A bit line 185 may be disposed on the upper insulating interlayer 175 to contact the bit line contact 180. The bit line 185 may have, for example, a linear shape extending in the second direction.

In some example embodiments, the bit line 185 may, for example, directly contact a top surface of the semiconductor pattern 115 without the bit line contact 180.

FIGS. 4 to 12 are cross-sectional views illustrating a method of manufacturing the vertical semiconductor device of FIGS. 2 and 3 in accordance with an example embodiment.

Figure 4:
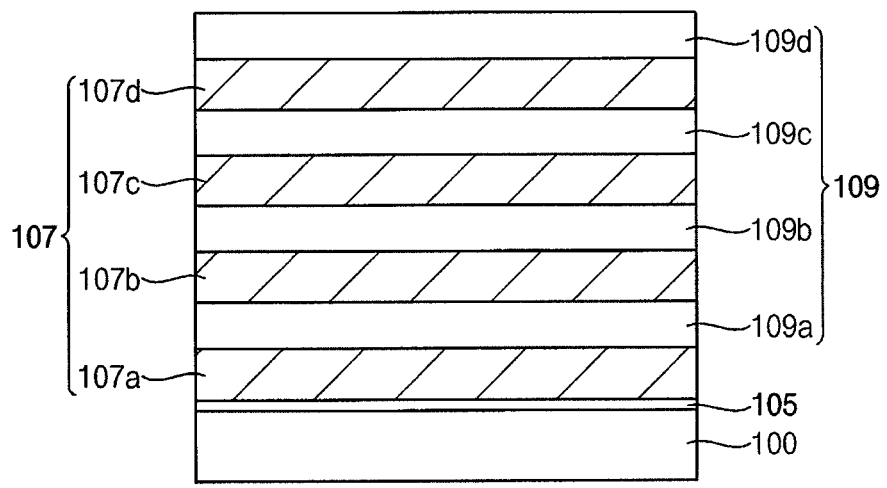

Referring to FIG. 4, a pad insulation layer 105 may be formed on a substrate 100. The pad insulation layer 105 may be formed by, for example, a thermal oxidation process on a top surface of the substrate 100. The pad insulation layer 105 may reduce stress that may be generated when a first sacrificial layer 107a is formed directly on the substrate 100. Sacrificial layers 107 and insulating interlayers 109 may be repeatedly and alternately formed on the pad insulation layer 105 in, for example, a direction vertical to a top surface of the substrate 100. That is, the first sacrificial layer 107a may be formed on the pad insulation layer 105, and a first insulating interlayer 109a may be formed on the first sacrificial layer 107a. Likewise, other sacrificial layers 107b, 107c and 107d and insulating interlayers 109b, 109c and 109d may be sequentially and alternately formed on each other. The insulating interlayers 109 and the sacrificial layers 107 may be formed by, for example, a chemical vapor deposition (CVD) process, a plasma enhanced chemical vapor deposition (PECVD) process, a spin-coating process, a high density plasma chemical vapor deposition (HDP-CVD) process, etc.

The sacrificial layers 107 may be formed using a material that may have an etching selectivity with respect to the insulating interlayers 109. In an example embodiment, the etching selectivity between the insulating interlayers 109 and the sacrificial layers 107 may be, for example, equal to or greater than about 1:80. The sacrificial layers 107 may also have an etching selectivity with respect to a semiconductor pattern 115 (see FIG. 8). That is, the sacrificial layers 107 may be formed using a material that may have an etching selectivity with respect to, for example, polysilicon. In some example embodiments, the etching selectivity between polysilicon and the sacrificial layers 107 may be, for example, equal to or greater than about 1:80.

The sacrificial layers 107 may be formed using a material that may be rapidly removed by, for example, a wet etching process so that the insulating interlayers 109 may be exposed to an etching solution for a very short time. Therefore, the insulating interlayers 109 may be prevented from being damaged or removed by the etching solution during the wet etching process for removing the sacrificial layers 107.

In some example embodiments, the insulating interlayers 109 may be formed using, for example, silicon oxide ($SiO_2$), and the sacrificial layers 107 may be formed using silicon nitride (SiN or $Si_3N_4$).

A transistor at each level may be formed in a space generated when the sacrificial layer 107 may be removed, and thus the number of the sacrificial layers 107 may be greater than or equal to the number of the transistors of a string including cell transistors and selection transistors.

In example embodiments, the string may include, for example, 4 cell transistors and 2 selection transistors. However, the number of the cell transistors and the selection transistors may be adjusted.

Figure 5:
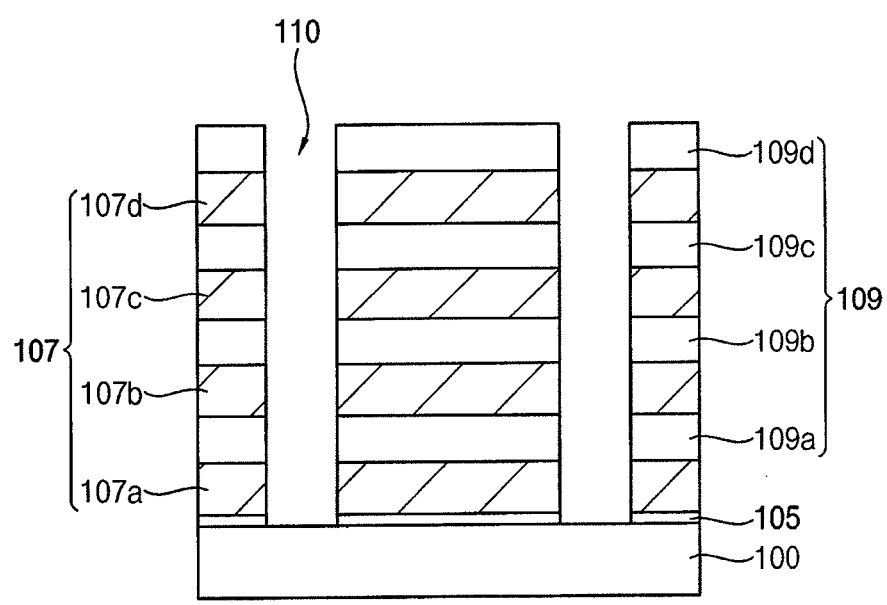

Referring to FIG. 5, a mask pattern (not illustrated) may be formed on the uppermost insulating interlayer 109d. The insulating interlayers 109, the sacrificial layers 107 and the pad insulation layer 105 may be partially and sequentially removed using the mask pattern as an etching mask to form a first opening 110 that may expose a top surface of the substrate 100.

In example embodiments, a plurality of first openings 110 may be formed, and the first openings 110 may have, for example, an island shape from each other. That is, the first openings 110 may be formed in both of the first and second directions that are substantially perpendicular to each other.

Figure 6:
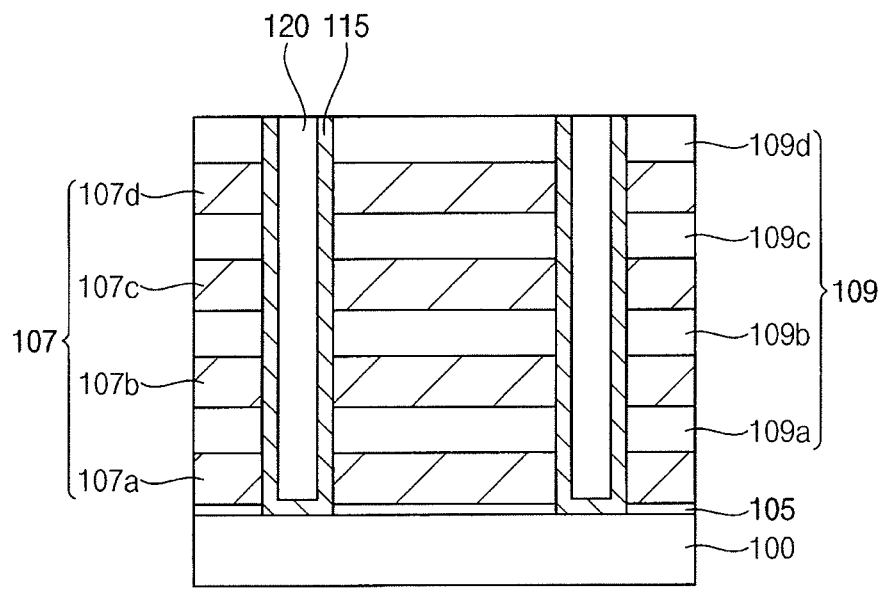

Referring to FIG. 6, a semiconductor pattern 115 may be formed on a bottom and a sidewall of the first opening 110. Thus, the semiconductor pattern 115 may have, for example, a hollow cylindrical shape or a cup shape. In some example embodiments, the semiconductor pattern 115 may be formed using, for example, polysilicon. The semiconductor pattern 115 may extend, for example, in the third direction and serve as a channel region for forming a string.

For example, for forming the semiconductor pattern 115, a seed layer may be formed on the bottom and the sidewall of the first opening 110, and then the seed layer may be grown into a polysilicon layer.

In this case, a silicon source gas, for example, silane ($SiH_4$) or dichlorosilane ($SiCl_2H_2$) gas may be used to form the polysilicon layer. However, a thin and uniform polysilicon layer may not be easily formed when the silicon source gas is used for forming the polysilicon layer. Further, when the polysilicon layer has a thickness less than about 300 Å, the polysilicon layer may have a non-uniform surface morphology including, e.g., protrusions or islands due to irregular growth of the polysilicon layer.

In example embodiments, the polysilicon layer may be formed on, for example, two layers or patterns having different material from each other. That is, the polysilicon layer may be formed on sidewalls of the sacrificial layers 107 and the insulating interlayers 109. In this case, the growth time for forming the polysilicon layer on each of the sacrificial layer 107 and the insulating interlayer 109 may be different from each other. Accordingly, the polysilicon layer may have an irregular shape along the sidewalls of the sacrificial layers 107 and the insulating interlayers 109.

Additionally, when the silicon source gas is used, a long growth time, a high growth temperature and/or a high pressure may be needed to form the polysilicon layer.

According to example embodiments, a seed layer may be formed using, for example, a first silicon source gas that has a relatively large molecular weight, and then the seed layer may be exposed to a second silicon source gas so that the seed layer may be grown into a polysilicon layer.

In some example embodiments, the seed layer may be formed on the bottom and the sidewall of the first opening 110 using, for example, the first silicon source gas. The first silicon source gas may include, for example, a material having a molecular weight of at least about 65 g/mol.

For example, the first silicon source gas may include hexachlorodisilane (HCD), Bis(ethlymethylamino)silane (BEMAS), Bis(diethylamino)silane (BDEAS), Bis(dimethylamino)silane (BDMAS), tris(dimethylamino)silane (Tris-DMAS), tetrakis(dimethylamino)silane (TDMAS), tris(ethlymethylamino)silane (Tris-EMAS), Diethylaminosiliane (DSAS), Bis(tertybutylamino)silane (BTBAS), Di-Isopropyl-Amino-Silane (DIPAS), etc. These may be used alone or in a mixture thereof.

The seed layer may be formed by, for example, a CVD process, a PECVD process, a low pressure chemical vapor deposition (LPCVD) process.

In some example embodiments, an impurity source gas may be further provided together with the first silicon source gas during the formation of the seed layer. For example, the impurity source gas may include phosphine ($PH_3$), diborane ($B_2H_6$), boron trichloride ($BCl_3$), ammonia ($NH_3$), arsine ($AsH_3$), boron tetrafluoride ($BF_4$), etc. These may be used alone or in a mixture thereof.

The seed layer may be exposed to the second silicon source gas so that the seed layer may be grown into the polysilicon layer. The second silicon source gas may include, for example, a silicon-containing material having a low molecular weight relative to the first silicon source gas. For example, the second silicon source gas may include silane ($SiH_4$), disilane ($Si_2H_6$) or trisilane ($Si_3H_8$), dichlorosilane ($SiCl_2H_2$). These may be used alone or in a mixture thereof.

In some example embodiments, the process for forming the seed layer using the first silicon source gas and the process for growing the seed layer into the polysilicon layer using the second silicon source gas may be performed, for example, in-situ in the same chamber. In an example embodiment, the temperature in the chamber may be maintained at, for example, about 300 to about 600° C., and the pressure in the chamber may be maintained, for example, at about 50 to about 100 Pa.

According to the above-mentioned processes, two different silicon source gases may be used in a hybrid-type, so that the polysilicon layer may be formed uniformly on both of the sacrificial layers 107 and the insulating interlayers 109 which have different materials from each other. Further, when the polysilicon layer is formed to have a thickness less than about 300 Å, the polysilicon layer may have a uniform morphology without having irregularity such as protrusions or islands. Furthermore, the polysilicon layer may be formed in a short growth time, at a low growth temperature and under a low growth pressure by using the first silicon source gas that has a relatively high molecular weight with respect to silane or dichlorosilane.

After forming the polysilicon layer, an insulation layer may be formed on the polysilicon layer to sufficiently fill the first opening 110. Upper portions of the polysilicon layer and the insulation layer may be planarized until the uppermost insulating interlayer 109d is exposed to form the semiconductor pattern 115 and a first insulation layer pattern 120. The semiconductor pattern 115 may have, for example, a hollow cylindrical shape or a cup shape, and the first insulation layer pattern 120 may have, for example, a solid cylindrical shape or a pillar shape.

Figure 7:
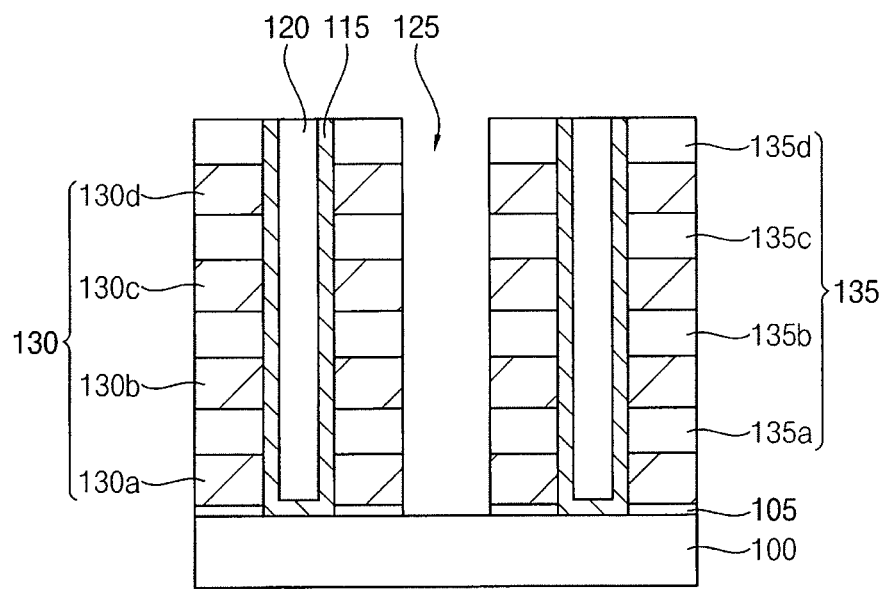

Referring to FIG. 7, the sacrificial layers 107 and the insulating interlayers 109 between the semiconductor patterns 115 may be partially etched to form a second opening 125. For example, a mask pattern (not shown) may be formed on the uppermost insulating interlayer 109d, and the insulating interlayers 109 and the sacrificial layers 107 may be sequentially and partially etched using the mask pattern as an etching mask to form the second opening 125. For example, in example embodiments, a plurality of second openings 125 may be formed in the second direction, and each second opening 125 may extend in the first direction. Accordingly, sacrificial layer patterns 130 and insulating interlayer patterns 135 may be formed to have, for example, a linear shape extending in the first direction. The sacrificial layer patterns 130 and the insulating interlayer patterns 135 may at least partially surround the outer sidewall of the semiconductor pattern 115.

Figure 8:
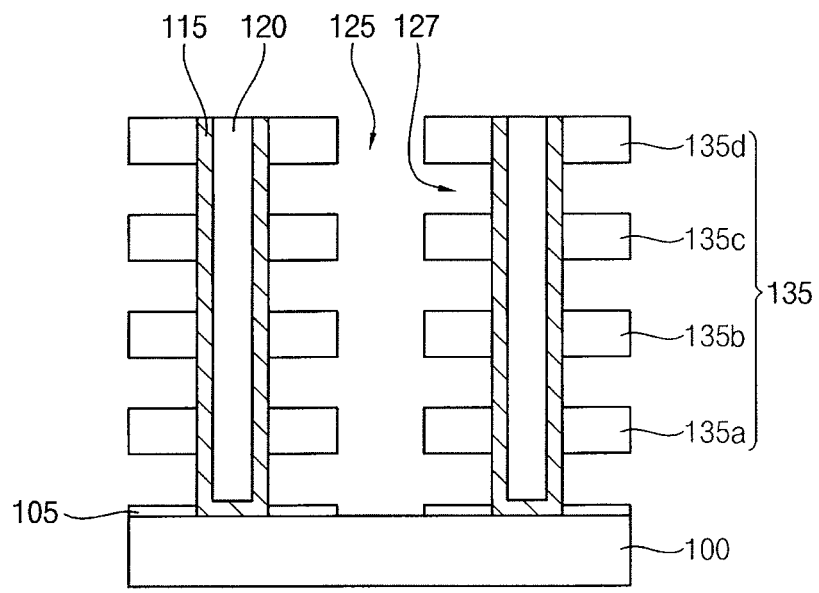

Referring to FIG. 8, the sacrificial layer patterns 130 exposed by the second opening 125 may be removed by, e.g., a wet etching process. In some example embodiments, the wet etching process may be performed using, for example, sulfuric acid or phosphoric acid when the sacrificial layer patterns 130 may include silicon nitride.

The insulating interlayer patterns 135a, 135b, 135c and 135d may remain on the outer sidewall of the semiconductor pattern 115 spaced apart from one another in the third direction. A plurality of the grooves 127 may be defined by spaces generated when the sacrificial layer patterns 130 are removed to partially expose the outer sidewall of the semiconductor pattern 115.

Figure 9:
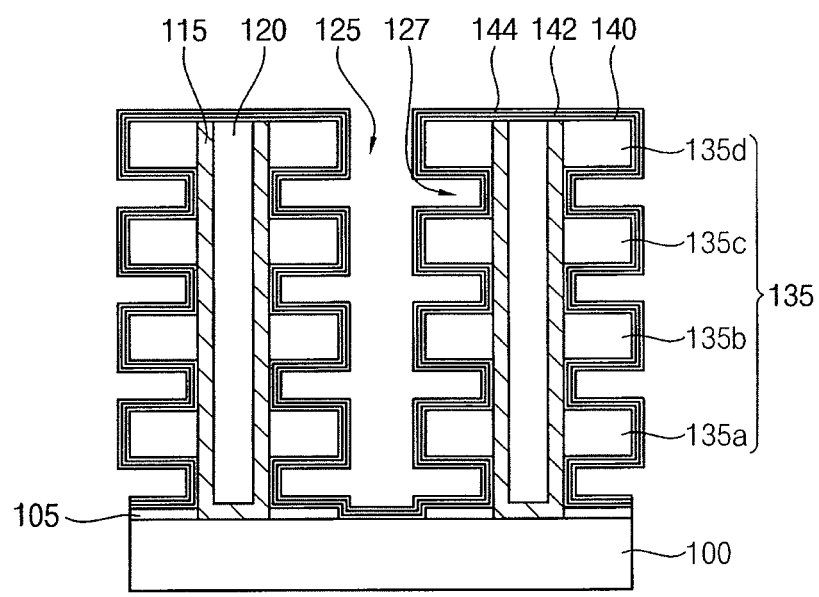

Referring to FIG. 9, a tunnel insulation layer 140, a charge trapping layer 142 and a blocking layer 144 may be formed sequentially on the exposed outer sidewall of the semiconductor pattern 115 and top surfaces of the insulating interlayer patterns 135.

The tunnel insulation layer 140 may be formed by depositing, e.g., silicon oxide. Alternatively, the tunnel insulation layer 140 may be formed, for example, only on the exposed outer sidewall of the semiconductor pattern 115 by a thermal oxidation process thereon.

The charge trapping layer 142 may be formed on the tunnel insulation layer 140. The charge trapping layer 142 may be formed using, for example, silicon nitride or a metal oxide by a CVD process, etc. The charge trapping layer 142 may be formed to be connected throughout all levels of the vertically stacked structure. However, the charge trapping layer 142 may include, for example, an insulating material so that the cell transistors may be insulated from one another.

The blocking layer 144 may be formed on the charge trapping layer 142. The blocking layer 144 may be formed using, for example, silicon oxide, a metal oxide such as aluminum oxide. In some example embodiments, the blocking layer 144 may be formed to be connected throughout all levels in a similar manner to that of the charge trapping layer 142.

Figure 10:
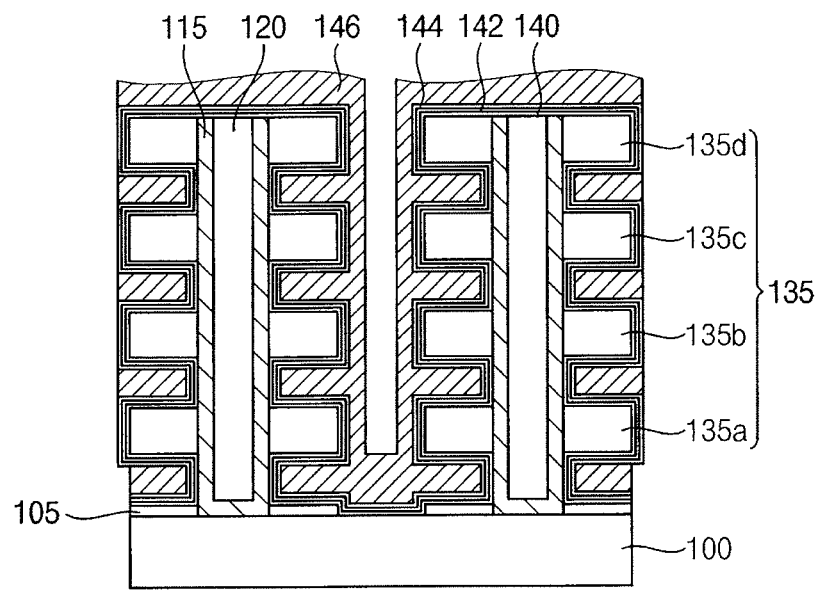

Referring to FIG. 10, a conductive layer 146 may be formed on the blocking layer 144 to sufficiently fill the grooves 127. The conductive layer 146 may be formed only to, for example, partially fill the second opening 125 such that that a portion of the conductive layer 146 may be easily removed by a subsequent process.

The conductive layer 146 may be formed using a conductive material that has good step coverage to prevent voids from being formed therein. The conductive material may include, for example, a metal or a metal nitride having a low resistance, such as for example, tungsten, tungsten nitride, titanium, titanium nitride, tantalum, tantalum nitride or platinum.

Figure 11:
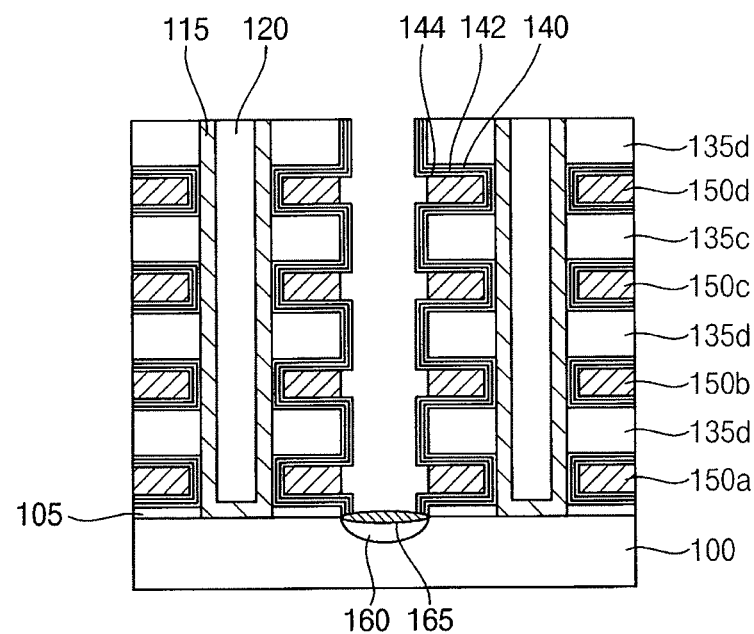

Referring to FIG. 11, a portion of the conductive layer 146 in the second opening 125 may be removed by, for example, a dry etching process or a wet etching process. Thus, the conductive layer 146 may remain only in the grooves 127 to form control gate electrodes 150a, 150b, 150c and 150d. Portions of the tunnel insulation layer 140, the charge trapping layer 142 and the blocking layer 144 on the bottom of the second opening 125 may be also removed to expose the top surface of the substrate 100.

The control gate electrodes 150a, 150b, 150c and 150d may be, for example, spaced apart from one another in the third direction. The control gate electrodes 150a, 150b, 150c and 150d at different levels may be insulated from each other by the insulating interlayer patterns 135. Each of the control gate electrodes 150a, 150b, 150c and 150d may have, for example, a linear shape extending in the first direction.

In some example embodiments, portions of the tunnel insulation layer 140, the charge trapping layer 142 and the blocking layer 144 formed on sidewalls of the insulating interlayer patterns 135 may be also removed together with the portion of the conductive layer 146. In this case, the tunnel insulation layer 140, the charge trapping layer 142 and the blocking layer 144 at different levels may be separated from each other.

Alternatively, as illustrated in FIG. 11, the tunnel insulation layer 140, the charge trapping layer 142 and the blocking layer 144 formed on the sidewalls of the insulating interlayer patterns 135 may not be removed. In this case, the tunnel insulation layer 140, the charge trapping layer 142 and the blocking layer 144 may be continuously connected throughout all the levels of the vertically stacked structure.

Referring to FIG. 11 again, an upper portion of the substrate 100 exposed by the second opening 125 may be doped with impurities, e.g., n-type impurities to form an impurity region 160. The impurity region 160 may serve as, for example, a CSL. In some example embodiments, a metal silicide pattern 165 may be further formed on the impurity region 160 to reduce resistance of the CSL.

By performing the above-mentioned processes, transistors of the vertical semiconductor device may be formed. An uppermost transistor and a lowermost transistor may serve as, for example, an SST and a GST, respectively.

Figure 12:
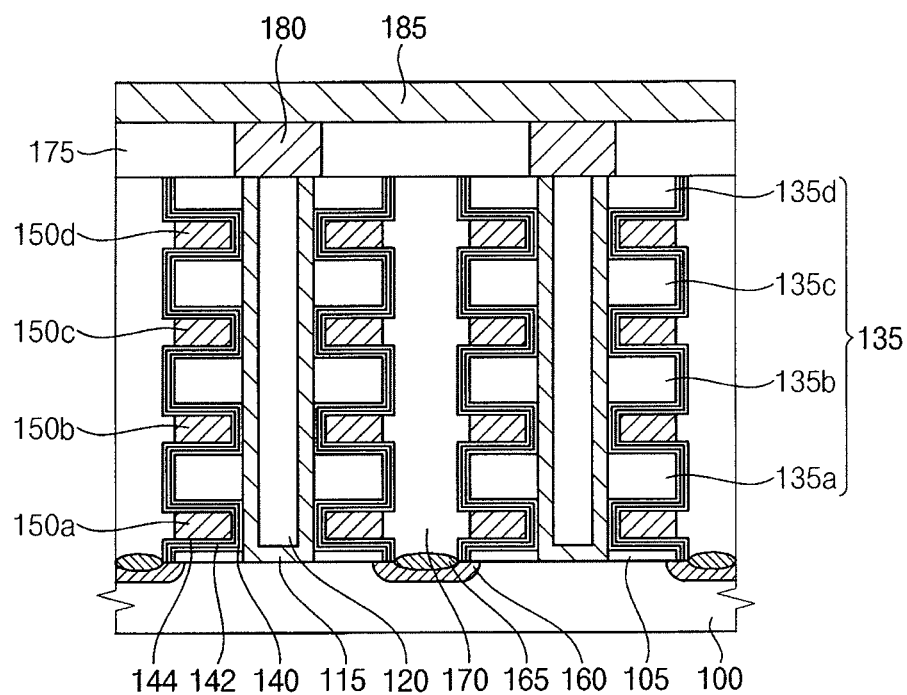

Referring to FIG. 12, an insulation layer may be formed to sufficiently fill the second opening 125, and an upper portion of the insulation layer may be planarized to form a second insulation layer pattern 170 in the second opening 125. An upper insulating interlayer 175 may be formed on the semiconductor pattern 115, the first insulation layer pattern 120, the second insulation layer pattern 170 and the uppermost insulating interlayer pattern 135d. A bit line contact 180 may be formed through the upper insulating interlayer 175 to contact a top surface of the semiconductor pattern 115. A bit line 185 may be formed on the upper insulating interlayer 175 to contact the bit line contact 180. The bit line 185 may have, for example, a linear shape extending in the second direction and may be electrically connected to the semiconductor pattern 115 via the bit line contact 180.

In some example embodiments, the bit line 185 may, for example, make direct contact with the semiconductor pattern 115 without the bit line contact 180.

Figure 13:
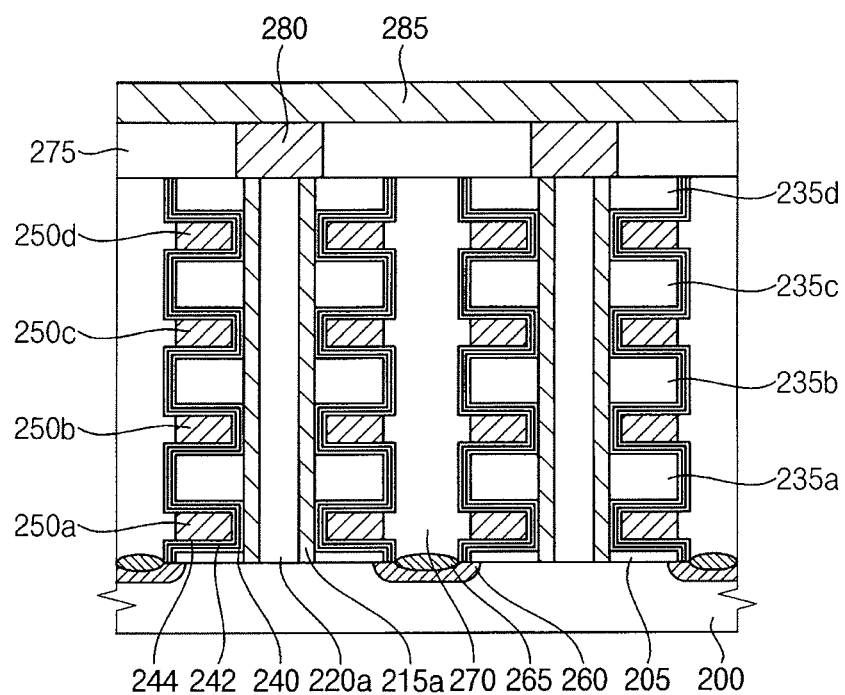
Figure 14:
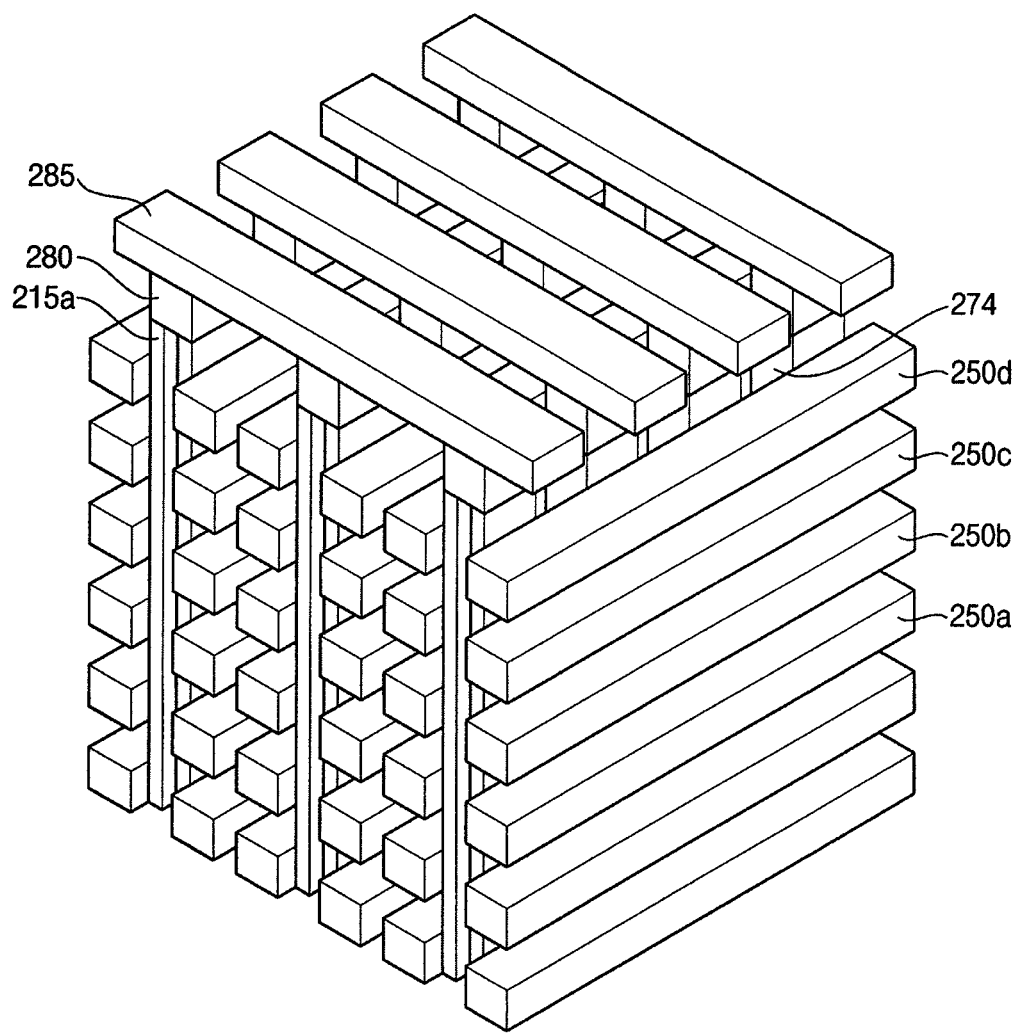

FIG. 13 is a cross-sectional view illustrating a vertical semiconductor device in accordance with an example embodiment. FIG. 14 is a perspective view illustrating the vertical semiconductor device of FIG. 13.

As illustrated in FIGS. 13 and 14, a semiconductor pattern 215a may have, for example, a bar shape, e.g., a rectangular parallelepiped shape. In example embodiments, a pair of semiconductor patterns 215a facing each other may be repeatedly arranged on a substrate 200 in both of the first and second directions. A first insulation layer pattern 220a may be disposed in a gap between the facing semiconductor patterns 215a.

Referring to FIG. 14, a third insulation layer pattern 274 may be disposed in a gap between structures each of which may include the pair of semiconductor patterns 215a and the first insulation layer pattern 220a. The first and third insulation layer patterns 220a and 274 may include, for example, silicon oxide. A pad insulation layer 205 may be disposed on the substrate 200 to reduce stress that may be generated when a sacrificial layers 207 are formed directly on the substrate 200.

Transistors of a string may be formed on an outer sidewall of the semiconductor pattern 215a. One semiconductor pattern 215a may serve as a channel region of the transistors. The transistors may be, for example, connected in series to each other in the third direction. Insulating interlayer patterns 235a, 235b, 235c and 235d may be disposed on the outer sidewall of the semiconductor pattern 215a to be spaced apart from each other in the third direction. Each of the insulating interlayer patterns 235a, 235b, 235c and 235d may have, for example, a linear shape extending in the first direction. Grooves exposing the outer sidewall of the semiconductor pattern 215a may be formed between the insulating interlayer patterns 235a, 235b, 235c and 235d, and gate structures of the transistors may be formed in the grooves, respectively. That is, the insulating interlayer patterns 235a, 235b, 235c and 235d may define regions in which the transistors are formed.

A tunnel insulation layer 240 may be formed on the outer sidewall of the semiconductor pattern 215a which is exposed by the grooves. The tunnel insulation layer 240 may be formed continuously on the outer sidewall of the semiconductor pattern 215a and surfaces of the insulating interlayer patterns 235a, 235b, 235c and 235d.

A charge trapping layer 242 may be formed on the tunnel insulation layer 240. The charge trapping layer 242 may include, for example, silicon nitride or a metal oxide in which electrons may be trapped. The charge trapping layer 242 may be formed continuously throughout all levels of the vertically stacked structure, or may be separated from each other at a plurality of levels.

A blocking layer 244 may be formed on the charge trapping layer 242. The blocking layer 244 may include, for example, silicon oxide or a metal oxide, e.g., aluminum oxide.

Control gate electrodes 250a, 250b, 250c and 250d may be disposed on the blocking layer to fill the grooves, respectively. The control gate electrodes 250a, 250b, 250c and 250d may serve as, for example, word lines.

Each of the control gate electrodes 250a, 250b, 250c and 250d may have, for example, a linear shape extending in the first direction. The control gate electrodes 250a, 250b, 250c and 250d may extend on the outer sidewall of the semiconductor pattern 215a, and may not surround the outer sidewall of the semiconductor pattern 215a in contrast to those illustrated with reference to FIGS. 2 and 3. The control gate electrodes 250a, 250b, 250c and 250d may include, for example, a metal or a metal nitride.

A second insulation layer pattern 270 may be disposed between structures each of which may include the control gate electrodes 250a, 250b, 250c and 250d and the insulating interlayer patterns 235a, 235b, 235c and 235d alternately stacked in the third direction. In example embodiments, a plurality of second insulation layer patterns 270, each of which may extend in the first direction, may be disposed in the second direction.

An impurity region 260 may be formed at an upper portion the substrate 200 under the second insulation layer pattern 270. The impurity region 260 may serve as, for example, a CSL. For example, the impurity region 260 may be doped with n-type impurities. A metal silicide pattern 265 may be further formed on the impurity region 260.

An upper insulating interlayer 275 may be formed on the semiconductor pattern 215a, the first, second and third insulation layer patterns 220a, 270 and 274 and the uppermost insulating interlayer pattern 235d. A bit line contact 280 may be formed through the upper insulating interlayer 275 to be electrically connected to the semiconductor pattern 215a. A bit line 285 may be formed on the upper insulating interlayer 275 to make contact with the bit line contact 280. Alternatively, the bit line 285 may make direct contact with the semiconductor pattern 215a without the upper insulating interlayer 275 and the bit line contact 280.

FIGS. 15 to 21 are cross-sectional views illustrating a method of manufacturing the vertical semiconductor device of FIGS. 13 and 14 in accordance with an example embodiment.

Hereinafter, the vertical semiconductor device including four transistors in one string will be described, as an example.

Figure 15:
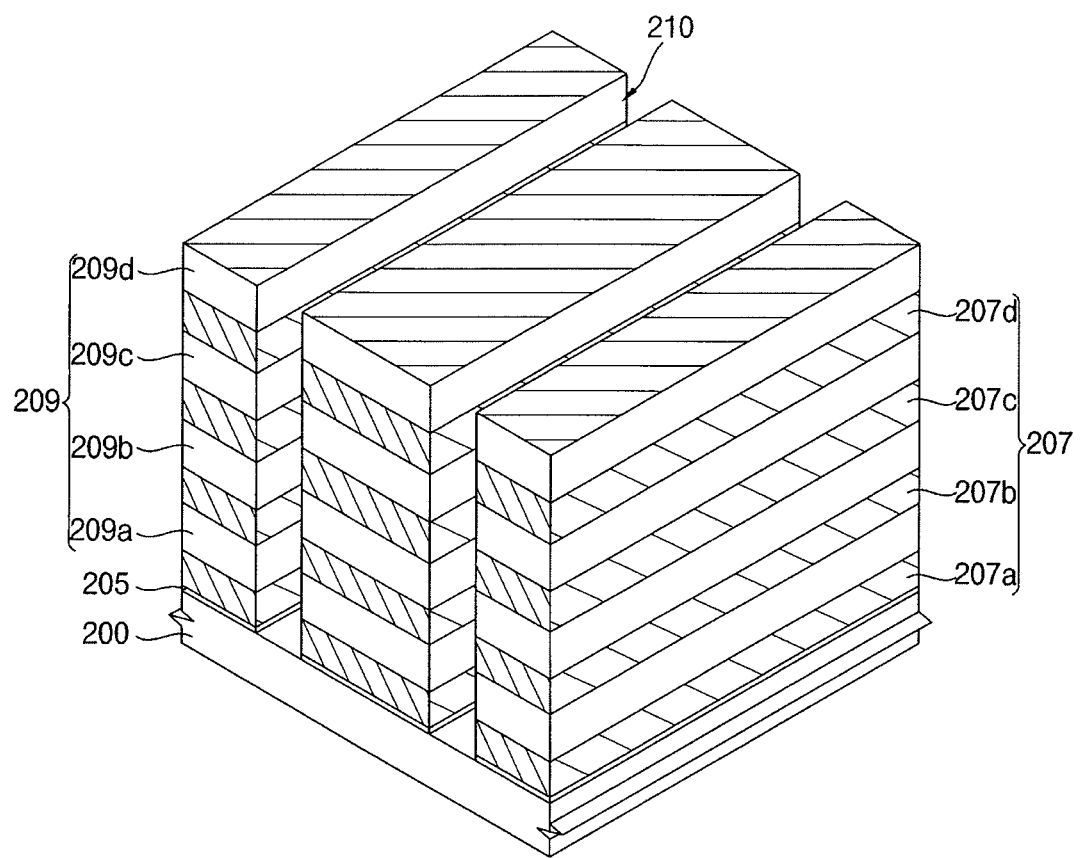

Referring to FIG. 15, a pad insulation layer 205, sacrificial layers 207 and insulating interlayers 209 may be formed on a substrate 200 by performing a process substantially the same as or similar to that illustrated with reference to FIG. 4.

An etching mask (not shown) may be formed on an uppermost insulating interlayer 209d. The sacrificial layers 207, the insulating interlayers 209 and the pad insulation layer 205 may be sequentially and partially removed using the etching mask to form a first opening 210. In example embodiments, the first opening 210 may have, for example, a linear shape extending in the first direction, and a plurality of first openings 210 may be formed in the second direction.

Figure 16:
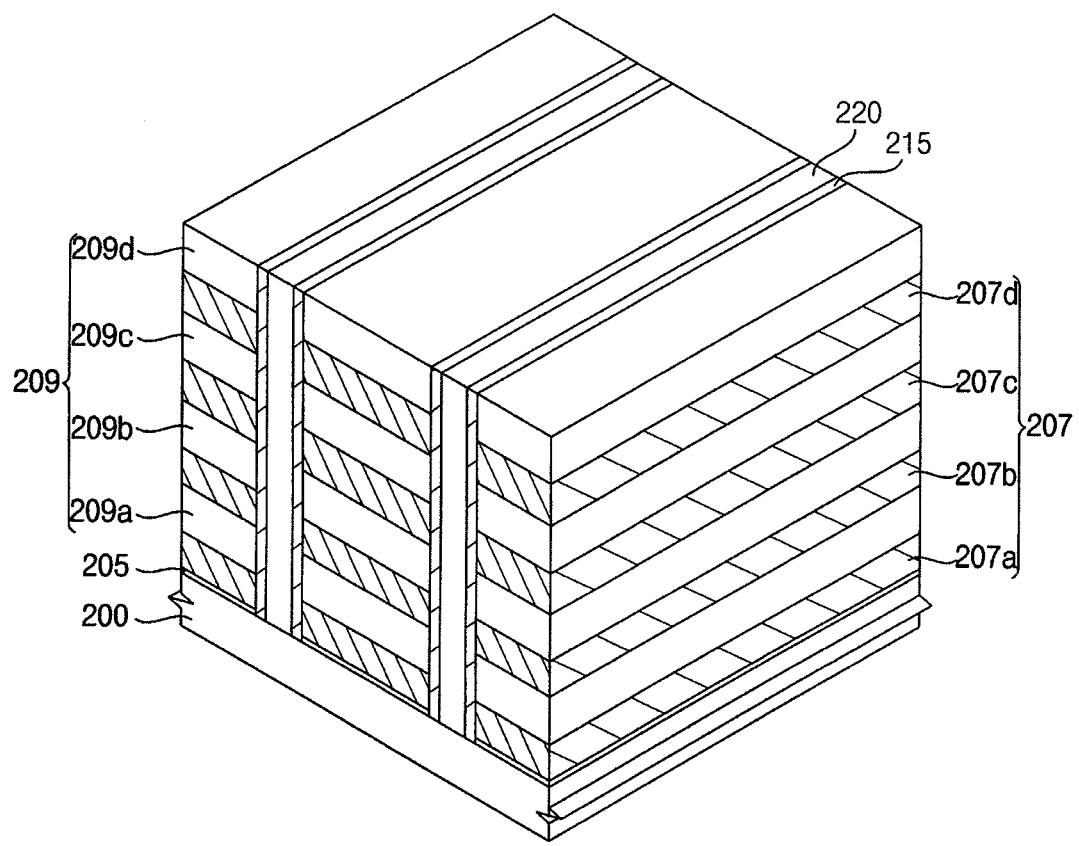

Referring to FIG. 16, a seed layer (not shown) may be formed on a sidewall of the first opening 210 using, for example, a first silicon source gas, and then the seed layer may be grown using, for example, a second silicon source gas to form a polysilicon layer by a process substantially the same as or similar to that illustrated with reference to FIG. 6. An insulation layer may be formed to sufficiently fill the first opening 210, and upper portions of the insulation layer and the polysilicon layer may be planarized to form a preliminary first insulation layer pattern 220 and a preliminary semiconductor pattern 215, respectively.

Figure 17:
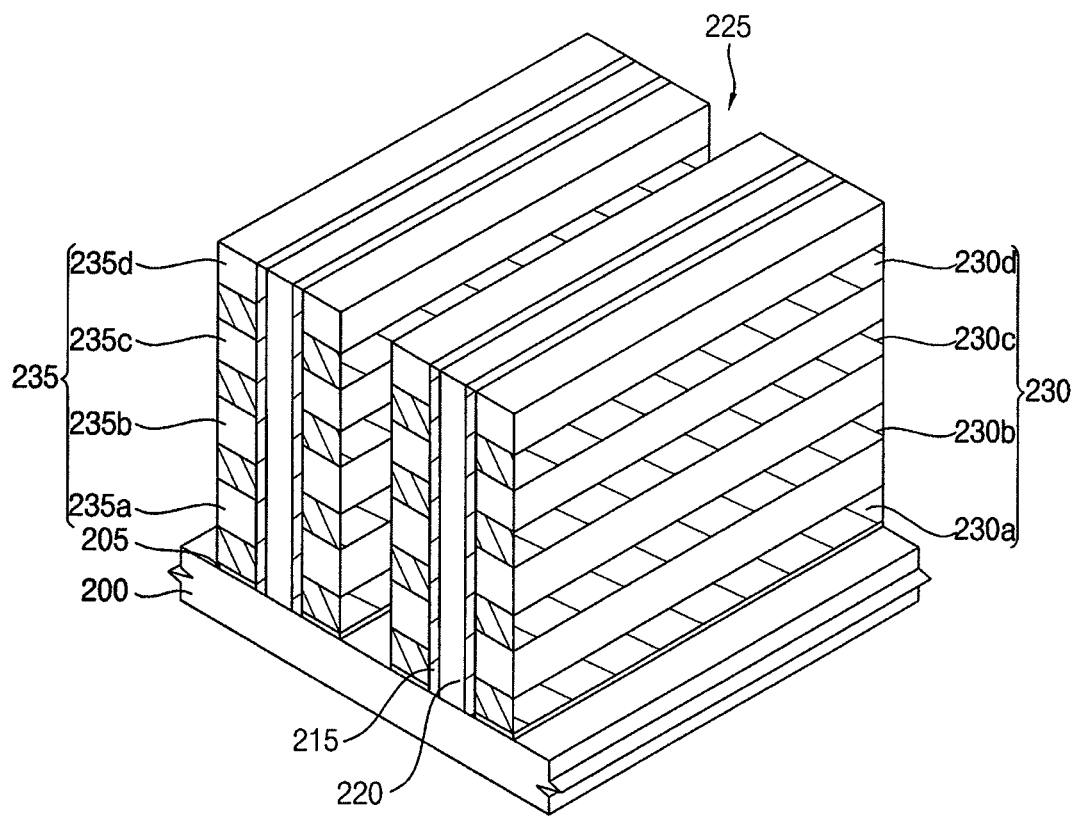

Referring to FIG. 17, the sacrificial layers 207 and the insulating interlayers 209 between structures each of which may include a pair of preliminary semiconductor patterns 215 and the preliminary first insulation layer pattern 220 may be partially etched to form a second opening 225. The second opening 225 may extend, for example, in the first direction. In some example embodiments, after forming an etching mask (not shown) on the uppermost insulating interlayer 209d, the insulating interlayers 209 and the sacrificial layers 207 may be sequentially and partially removed by an etching process using the etching mask to form the second opening 225. Sacrificial layer patterns 230 and insulating interlayer patterns 235 may be formed on an outer sidewall of the preliminary semiconductor pattern 215 to have, for example, a linear shape extending in the first direction.

Figure 18:
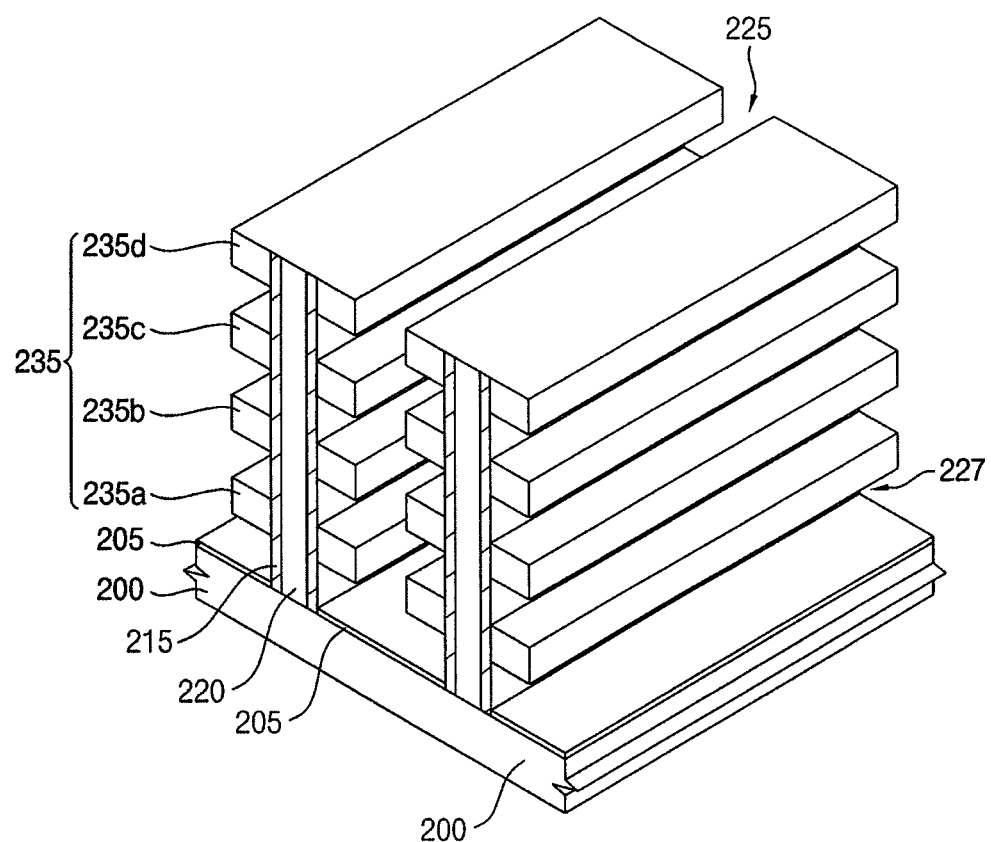

Referring to FIG. 18, the sacrificial layer patterns 230 exposed by the second opening 225 may be removed by a process substantially the same as or similar to that illustrated with reference to FIG. 8 to form a plurality of grooves 227.

Figure 19:
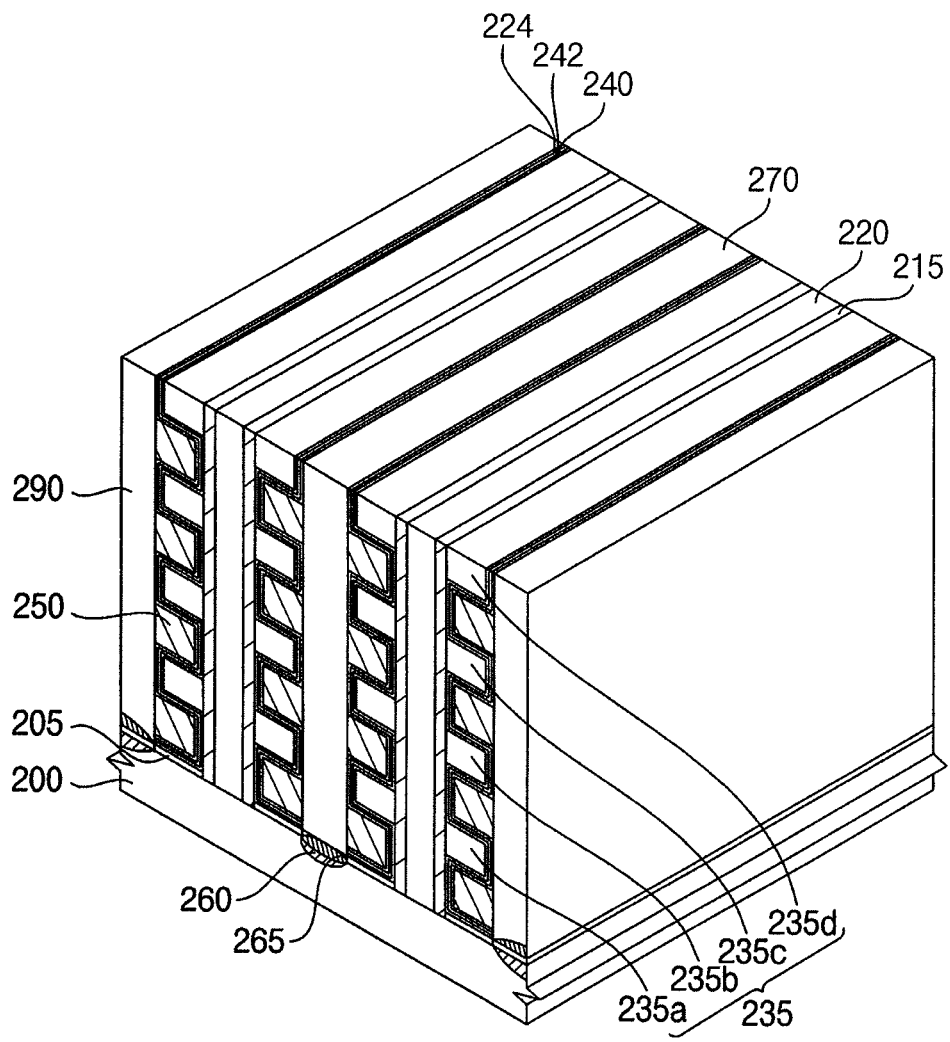

Referring to FIG. 19, processes substantially the same as or similar to those illustrated with reference to FIGS. 9 and 11 may be performed. In example embodiments, a tunnel insulation layer 240, a charge trapping layer 242 and a blocking layer 244 may be formed sequentially on the exposed outer sidewall of the preliminary semiconductor pattern 215 and surfaces of the insulating interlayer patterns 235. A conductive layer may be formed on the blocking layer 244 to sufficiently fill the grooves 227.

A portion of the conductive layer in the second opening 225 may be etched by a process substantially the same as or similar to that illustrated with reference to FIG. 11. In some example embodiments, portions of the tunnel insulation layer 240, the charge trapping layer 242 and the blocking layer 244 on a bottom of the second opening 225 may be removed to expose a top surface of the substrate 200.

By performing the above processes, control gate electrodes 250 may be formed between the insulating interlayer patterns 235. The control gate electrode 250 at each level may have a linear shape extending in the first direction. The control gate electrodes 250 in different levels may be insulated from each other by the insulating interlayer patterns 235.

An upper portion of the substrate 200 exposed by the second opening 225 may be doped with impurities, e.g., n-type impurities, to form an impurity region 260, which may serve as, for example, a CSL. In some example embodiments, a metal silicide pattern 265 may be further formed on the impurity region 260 to reduce resistance of the CSL.

An insulation layer may be formed on the substrate 200 to sufficiently fill the second opening 225, and an upper portion of the insulation layer may be planarized to form a second insulation layer pattern 270 in the second opening 225.

Figure 20:
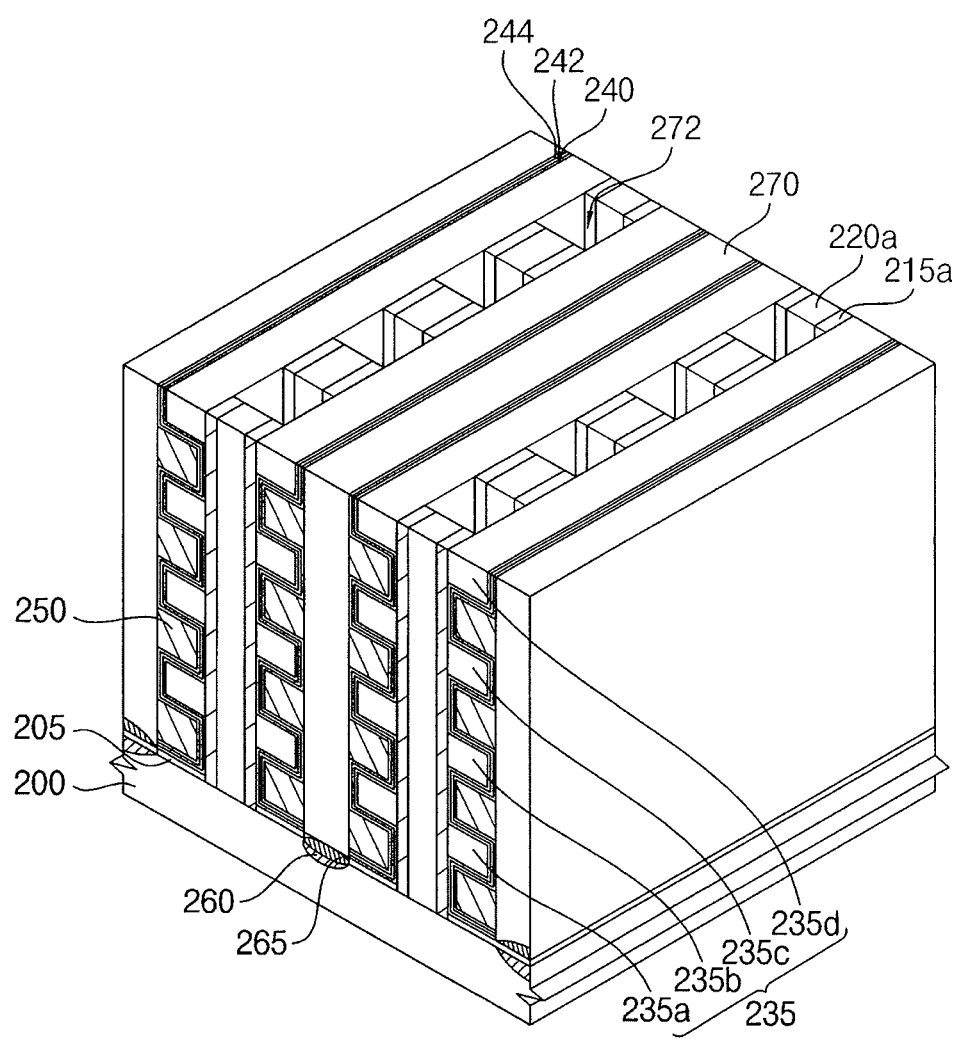

Referring to FIG. 20, a mask pattern (not illustrated) extending in the second direction may be formed on the resultant structure illustrated in FIG. 19. The preliminary semiconductor pattern 215 and the preliminary first insulation layer pattern 220 may be partially removed using the mask pattern as an etching mask to form openings 272. Accordingly, a semiconductor pattern 215a and a first insulation layer pattern 220a may be formed to have, for example, a bar shape, e.g., a rectangular parallelepiped shape.

Figure 21:
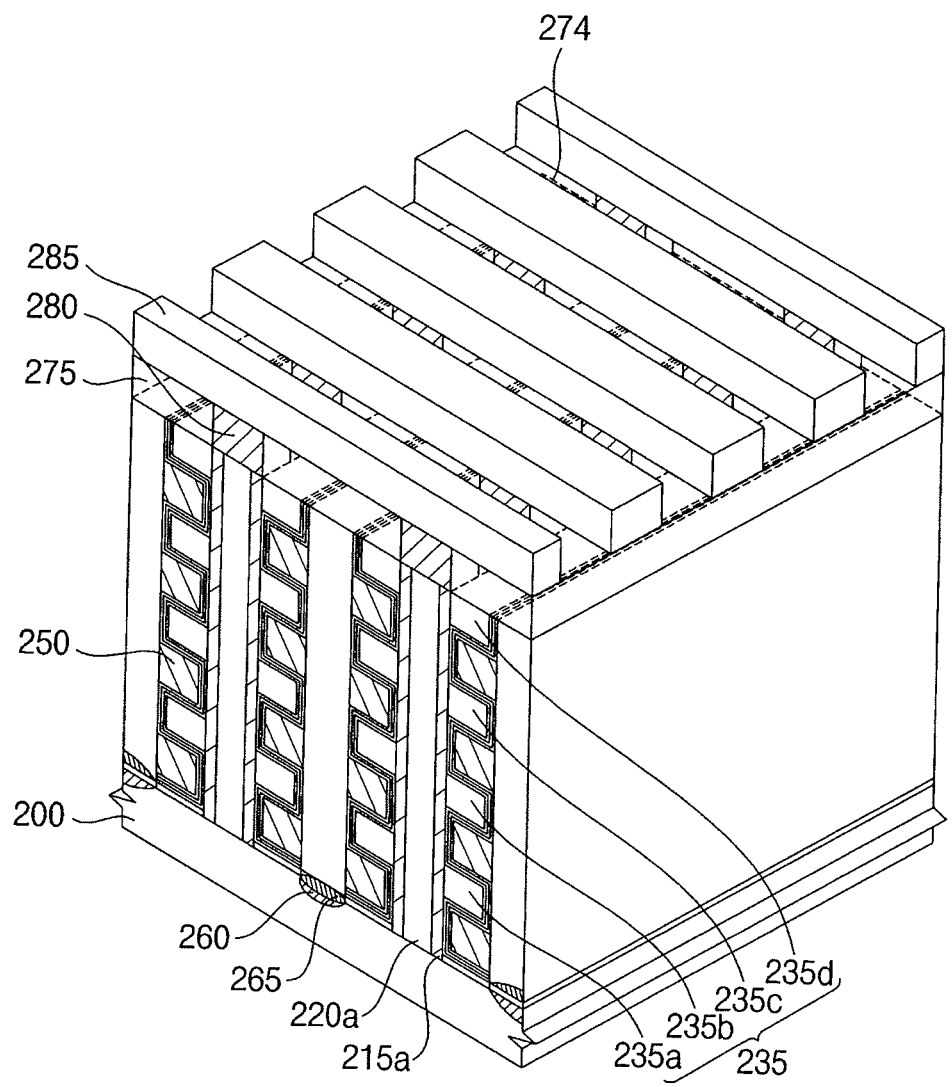

Referring to FIG. 21, third insulation layer patterns 274 may be formed to fill the openings 272. For example, in example embodiments, a silicon oxide layer may be formed to sufficiently fill the openings 272, and an upper portion of the silicon oxide layer may be planarized until a top surface of the uppermost insulating interlayer pattern 235d is exposed to form the third insulation layer patterns 274.

An upper insulating interlayer 275 may be formed on the semiconductor patterns 215a, the first, second and third insulation layer patterns 220a, 270 and 274 and the uppermost insulating interlayer pattern 235d. A bit line contact 280 may be formed through the upper insulating interlayer 275 to be electrically connected to the semiconductor pattern 215a. A bit line 285 may be formed on the upper insulating interlayer 275 to make contact with the bit line contact 280. In example embodiments, a plurality of the bit lines 285 each of which may extend in the second direction may be formed repeatedly in the first direction.

Alternatively, the bit line 285 may be formed to make direct contact with the semiconductor pattern 215a without the bit line contact 280.

The methods of forming the polysilicon layer according to example embodiments may be applied to other types of semiconductor devices including, for example, a thin polysilicon layer.

Figure 22:
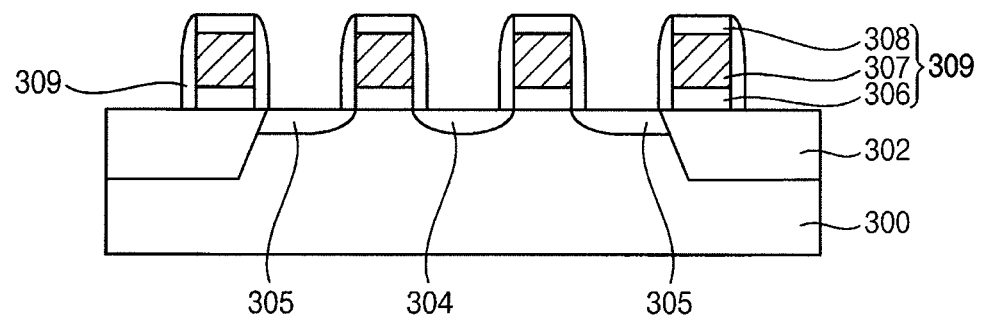
FIGS. 22 to 24 are cross-sectional views illustrating a method of manufacturing a semiconductor device in accordance with an example embodiment.
Figure 23:
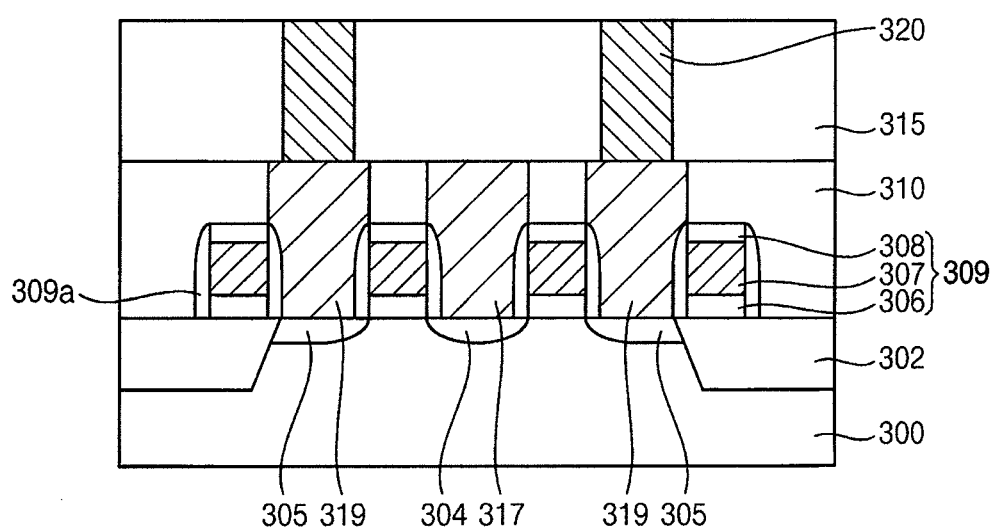
Figure 24:
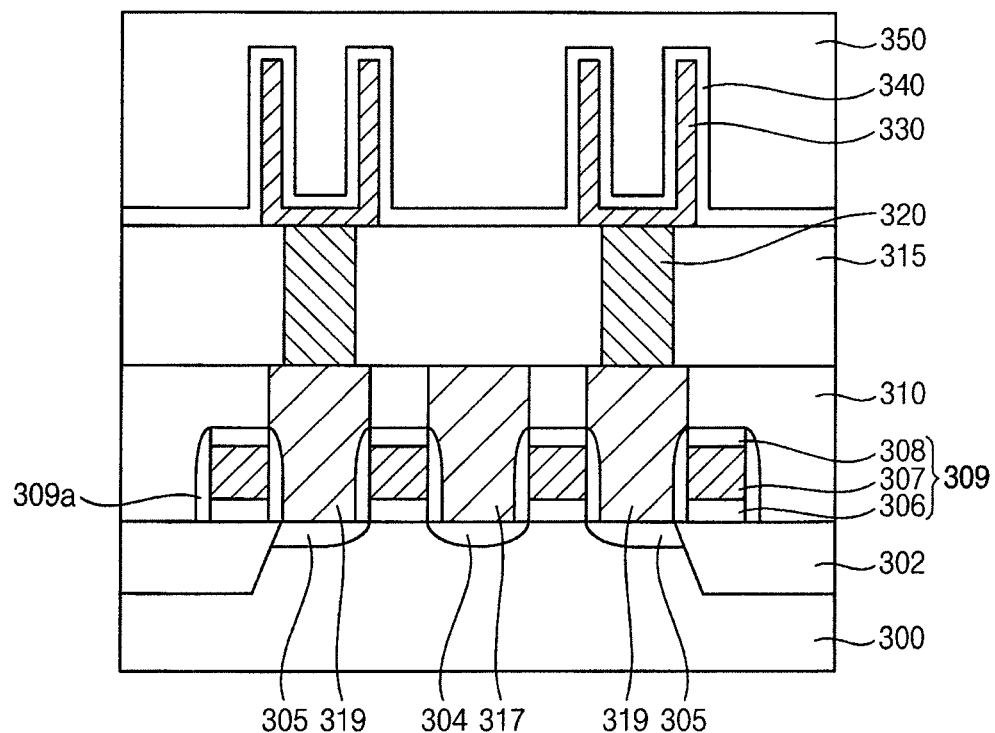

FIGS. 22 to 24 are cross-sectional views illustrating a method of manufacturing a semiconductor device in accordance with an example embodiment. Specifically, FIGS. 22 to 24 illustrate a method of manufacturing a dynamic random access memory (DRAM) device.

Referring to FIG. 22, an isolation layer 302 may be formed on a substrate 300. In example embodiments, the isolation layer 302 may be formed by, for example, a shallow trench isolation (STI) process.

A gate insulation layer, a gate electrode layer and a gate mask layer may be sequentially formed on the substrate 300. The gate insulation layer, the gate electrode layer and the gate mask layer may be patterned by, e.g., a photolithography process to form a plurality of gate structures 309 on the substrate 300. Each gate structure 309 may include, for example, a gate insulation layer pattern 306, a gate electrode 307 and a gate mask 308 sequentially stacked on the substrate 300. The gate insulation layer may be formed using, for example, silicon oxide or a metal oxide. The gate electrode layer may be formed using, for example, a doped polysilicon or a metal. The gate mask layer may be formed using, for example, silicon nitride.

Impurities may be implanted onto the substrate 300 using, for example, the gate structures 309 as an ion implantation mask to form first and second impurity regions 304 and 305 at upper portions of the substrate 300 adjacent to the gate structures 309. The first and second impurity regions 304 and 305 may serve as, for example, source and drain regions of transistors.

The transistors may be defined by the gate structures 309 and the first and second impurity regions 304 and 305. In some example embodiments, spacers 309a may be further formed on sidewalls of the gate structures 309.

Referring to FIG. 23, a first insulating interlayer 310 may be formed on the substrate 300 to cover the gate structures 309 and the spacers 309a. The first insulating interlayer 310 may be formed using, for example, silicon oxide. The first insulating interlayer 310 may be partially etched to form first holes (not illustrated) exposing the first and second impurity regions 304 and 305, respectively. In some example embodiments, the first holes may be self-aligned with the gate structures 309 and the spacers 309a.

A first plug 317 and a second plug 319 may be formed to fill the first holes and to be electrically connected to the first and second impurity regions 304 and 305, respectively. The methods of forming a polysilicon layer according to an example embodiment of the present inventive concept may be used for forming the first and second plugs 317 and 319.

In example embodiments, a seed layer (not shown) may be formed on the first insulating interlayer 310 and on a bottom and a sidewall of the first holes using a first source gas having a relatively high molecular weight. For example, in some example embodiments, an impurity source gas may be provided together with the first silicon source gas.

For example, the first silicon source gas may include hexachlorodisilane (HCD), Bis(ethlymethylamino)silane (BEMAS), Bis(diethylamino)silane (BDEAS), Bis(dimethylamino)silane (BDMAS), tris(dimethylamino)silane (Tris-DMAS), tetrakis(dimethylamino)silane (TDMAS), tris(ethlymethylamino)silane (Tris-EMAS), Diethylaminosiliane (DEAS), Bis(tertybutylamino)silane (BTBAS), Di-Isopropyl-Amino-Silane (DIPAS), etc. These may be used alone or in a mixture thereof.

The impurity source gas may include, for example, $PH_3$, $B_2H_6$, $BCl_3$, $NH_3$, $AsH_3$, $BF_4$, etc. These may be used alone or in a mixture thereof.

The seed layer may be exposed to a second silicon source gas so that the seed layer may be grown into, for example, a polysilicon layer filling the first hole. The second silicon source gas may include, for example, a silicon-containing material having a low molecular weight relative to the first silicon source gas. For example, the second silicon source gas may include silane ($SiH_4$), disilane ($Si_2H_6$) or dilsilane ($Si_3H_8$) or dichlorosilane ($SiCl_2H_2$). These may be used alone or in a mixture thereof.

In some example embodiments, the process for forming the seed layer using the first silicon source gas and the process for growing the seed layer into the polysilicon layer using the second silicon source gas may be performed, for example, in-situ in the same chamber. For example, in an example embodiment, the temperature in the chamber may be maintained at about 300 to about 600° C., and the pressure in the chamber may be maintained at 50 to 100 Pa.

An upper portion of the polysilicon layer may be planarized by, e.g., a chemical mechanical polish (CMP) process and/or an etch-back process until a top surface of the first insulating interlayer 310 is exposed to form the first and second plugs 317 and 319 in the first holes. The first plug 317 may serve as, for example, a bit line contact.

According to the above-mentioned processes, the first silicon source gas having a relatively high molecular weight and the second silicon source gas having a relatively low molecular weight may be used in a hybrid-type, so that the polysilicon layer may be formed uniformly on both of the first insulating interlayer 310 and the spacer 309a which have different materials from each other. Additionally, when the first hole has a minute line width due to the high integration degree of the transistors, the polysilicon layer may be formed uniformly without having irregularity such as voids or islands. Furthermore, the polysilicon layer may be formed in a short growth time, at a low growth temperature and under a low growth pressure by using the first silicon source gas that has a relatively high molecular weight with respect to silane or dichlorosilane.

A first conductive layer (not illustrated) may be formed on the first insulating interlayer 310 to make contact with the first plug 317. The first conductive layer may be patterned to form a bit line (not illustrated). The first conductive layer may be formed using, for example, doped polysilicon or a metal.

A second insulating interlayer 315 may be formed on the first insulating interlayer 310 to cover the bit line. The second insulating interlayer 315 may be partially etched to form a second hole (not illustrated) that exposes a top surface of the second plug 319. A second conductive layer may be formed on the second plug 319 and the second insulating interlayer 315 to fill the second hole. An upper portion of the second conductive layer may be planarized until a top surface of the second insulating interlayer 315 is exposed to form a third plug 320 in the second hole that is electrically connected to the second plug 319. The second conductive layer may be formed using, for example, doped polysilicon or a metal. The second and third plugs 319 and 320 may serve as, for example, capacitor contacts. Alternatively, the third plug 320 may be formed to make direct contact with the second impurity region 305 through the first and second insulating interlayers 310 and 315 without the second plug 319, such that the third plug 320 may solely serve as a capacitor contact. In this case, the third plug 320 may be formed using the method of fowling a polysilicon layer according to an example embodiment of the present inventive concept.

Referring to FIG. 24, an etch-stop layer (not illustrated) and a mold layer (not illustrated) may be formed on the second insulating interlayer 315. The mold layer and the etch-stop layer may be partially removed to four an opening (not illustrated) that exposes a top surface of the third plug 320.

A lower electrode layer may be formed on an inner wall of the opening and a top surface of the mold layer. The lower electrode layer may be formed using, for example, a metal or a metal nitride, e.g., titanium, titanium nitride, tantalum, tantalum nitride, tungsten nitride etc., or doped polysilicon. A sacrificial layer (not illustrated) may be formed on the lower electrode layer, and then the sacrificial layer and the lower electrode layer may be partially removed to expose a top surface of the mold layer. The sacrificial layer and the mold layer may be removed to form a lower electrode 330 that is electrically connected to the third plug 320.

A dielectric layer 340 may be formed on the etch-stop layer and the second insulating interlayer 315 to cover the lower electrode 330. The dielectric layer 340 may be formed using, for example, a material having a higher dielectric constant than that of silicon nitride or silicon oxide.

An upper electrode 350 may be formed on the dielectric layer 340. The upper electrode 350 may be formed using, for example, a metal and/or a metal nitride such as titanium nitride, tantalum nitride, tungsten nitride, ruthenium, etc., thereby forming a capacitor that includes the lower electrode 330, the dielectric layer 340 and the upper electrode 350.

By performing the processes illustrated above, a DRAM device including the gate structures and the capacitors may be manufactured.

The method of forming a polysilicon layer of an exemplary embodiment of the present inventive concept may be used to form, for example, a polysilicon layer or a polysilicon pattern on layers including different materials in manufacturing various semiconductor devices.

Figure 25A:
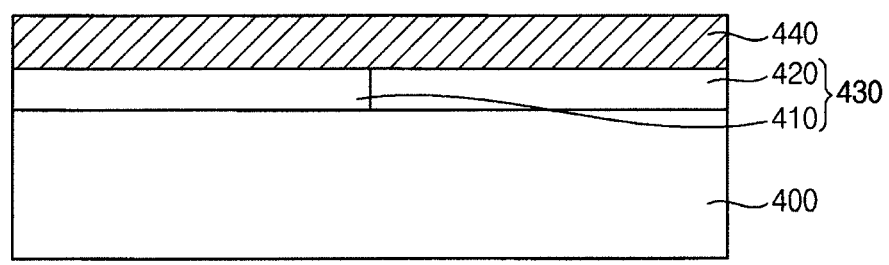
FIGS. 25a and 25b are cross-sectional views illustrating a method of manufacturing a semiconductor device in accordance with an example embodiment.
Figure 25B:
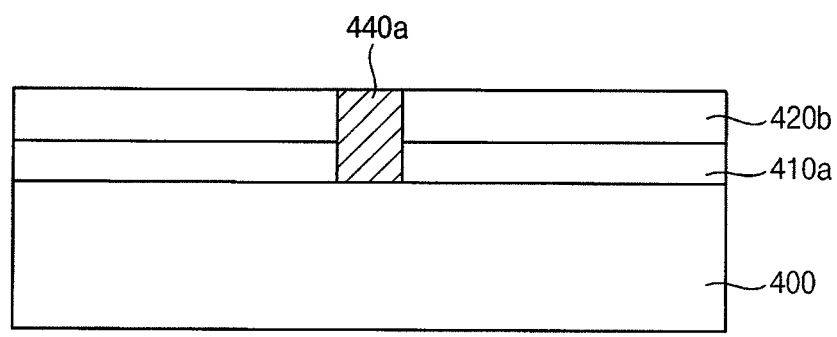

FIGS. 25A and 25B are cross-sectional views illustrating a method of manufacturing a semiconductor device in accordance with an example embodiment.

Referring FIG. 25A, an insulation layer 430 including, for example, a first layer 410 and a second layer 420 may be formed on a substrate 400. For example, in some example embodiments, the first layer 410 may include silicon oxide and the second layer 420 may include silicon nitride.

A seed layer (not shown) may be formed on the first layer 410 and the second layer 420 using, for example, a first silicon source gas and/or an impurity source gas. The seed layer may be formed under conditions substantially the same as or similar to those described with reference to FIGS. 6 and 23.

The seed layer may be exposed to a second silicon source gas to be grown into a polysilicon layer 440. The second silicon source gas may include, for example, a silicon-containing material having a lower molecular weight than that included in the first silicon source gas. The polysilicon layer may be also formed under conditions substantially the same as or similar to those described with reference to FIGS. 6 and 23.

Referring to FIG. 25B, a first layer 410*a* and a second layer 420*a* may be sequentially stacked on the substrate 400. In some example embodiments, the first and second layers 410*a* and 420*a* may include, for example, silicon oxide and silicon nitride, respectively, or vice versa. A hole (not illustrated) penetrating the second layer 420*a* and the first layer 410*a* may be formed. A seed layer (not shown) may be formed on an inner wall of the hole and the second layer 420*a* by a process substantially the same as or similar to that described in FIG. 25A.

The seed layer may be exposed to a second silicon source gas to be grown into a polysilicon layer filling the hole. The polysilicon layer may be formed by a process substantially the same as or similar to that described in FIG. 25A.

An upper portion of the polysilicon layer may be planarized by, e.g., a CMP process or an etch-back process until a top surface of the second layer 420*a* is exposed to form a polysilicon pattern 440*a* in the hole.

Having described example embodiments of the present inventive concept, it is further noted that it is readily apparent to those of reasonable skill in the art that various modifications may be made without departing from the spirit and scope of the invention which is defined by the metes and bounds of the appended claims.

What is claimed is:

1. A method of manufacturing a semiconductor device, comprising:
    forming a plurality of sacrificial layers and a plurality of insulating interlayers repeatedly and alternately on a substrate, the insulating interlayers including a different material from a material of the sacrificial layers;
    forming at least one opening through the insulating interlayers and the sacrificial layers, the at least one opening exposing the substrate;
    forming a seed layer on an inner wall of the at least one opening using a first silicon source gas;
    forming a polysilicon channel in the at least one opening by growing the seed layer;
    removing the sacrificial layers to form a plurality of grooves between the insulating interlayers; and
    forming a plurality of gate structures in the grooves, respectively.

2. The method of claim 1, wherein the first silicon source gas has a molecular weight no less than about 65 g/mol.

3. The method of claim 2, wherein the first silicon source gas includes at least one selected from hexachlorodisilane (HCD), Bis(ethlymethylamino)silane (BEMAS), Bis(diethylamino)silane (BDEAS), Bis(dimethylamino)silane (BDMAS), tris(dimethylamino)silane (Tris-DMAS), tetrakis (dimethylamino)silane (TDMAS), tris(ethlymethylamino) silane (Tris-EMAS), Diethylaminosiliane (DEAS), Bis (tertybutylamino)silane (BTBAS) and Di-Isopropyl-Amino-Silane (DIPAS).

4. The method of claim 1, wherein the forming the polysilicon channel includes exposing the seed layer to a second silicon source gas.

5. The method of claim 4, wherein the exposing the seed layer to the second silicon source gas and the forming the seed layer are performed in-situ in the same chamber.

6. The method of claim 4, wherein the second silicon source gas includes at least one selected from silane ($SiH_4$), disilane ($Si_2H_6$), trisilane ($Si_3H_8$) and dichlorosilane ($SiCl_2H_2$).

7. The method of claim 1, wherein the forming the seed layer includes providing an impurity source gas.

8. The method of claim 7, wherein the impurity source gas includes at least one selected from phosphine ($PH_3$), diborane ($B_2H_6$), boron trichloride ($BCl_3$), ammonia ($NH_3$), arsine ($AsH_3$) and boron terafluoride ($BF_4$).

9. The method of claim 1, wherein the polysilicon channel has a thickness less than about 300 Å.

10. The method of claim 1, wherein the sacrificial layers are formed using silicon nitride and the insulating interlayers are formed using silicon oxide.

11. The method of claim 1, wherein the forming of the gate structures includes:
    sequentially forming a tunnel insulation layer, a charge trapping layer and a blocking layer on outer sidewalls of the polysilicon channel exposed by the grooves and surfaces of the insulating interlayers;
    forming a conductive layer on the blocking layer to fill the grooves; and
    partially removing the conductive layer to form gate electrodes in the grooves.

12. The method of claim 1, further comprising forming an insulation layer pattern to fill a remaining portion of the at least one opening after forming the polysilicon channel.

13. A method of manufacturing a semiconductor device, comprising:
    forming a transistor on a substrate, the transistor including a gate structure and source/drain regions;
    forming an insulating interlayer on the substrate to cover the transistor;
    forming a plurality of holes exposing the source/drain regions through the insulating interlayer;
    forming a seed layer on inner walls and bottoms of the holes using a first silicon source gas and an impurity source gas;
    forming polysilicon plugs that fill the holes by growing the seed layer using a second silicon source gas, wherein the second silicon source gas includes a silicon-containing material having a lower molecular weight than a molecular weight of a silicon-containing material included in the first silicon source gas; and
    forming a plurality of capacitors electrically connected to the plugs.

14. The method of claim 13, wherein the first silicon source gas includes at least one selected from hexachlorodisilane (HCD), Bis(ethylmethylamino)silane (BEMAS), Bis(diethylamino)silane (BDEAS), Bis(dimethylamino)silane (BDMAS), tris(dimethylamino)silane (Tris-DMAS), tetrakis (dimethylamino)silane (TDMAS), tris(ethylmethylamino) silane (Tris-EMAS), Diethylaminosiliane (DEAS), Bis (tertybutylamino)silane (BTBAS) and Di-Isopropyl-Amino-Silane (DIPAS).

15. The method of claim 14, wherein the second silicon source gas includes at least one selected from silane ($SiH_4$), disilane ($Si_2H_6$), trisilane ($Si_3H_8$) and dichlorosilane ($SiCl_2H_2$) gas.

16. A method of manufacturing a semiconductor device, comprising:
    forming a pad insulation layer on a substrate;
    forming a plurality of sacrificial layers and a plurality of insulating interlayers repeatedly and alternately on the pad insulation layer, wherein the etching selectivity between the insulating interlayers and the sacrificial layers is no less than about 1:80;

partially and sequentially removing the insulating interlayer, the sacrificial layers and the pad insulation layer to form a first opening that exposes a top surface of the substrate;

forming a seed layer on an inner sidewall and a bottom of the first opening using a first silicon source gas and growing the seed layer using a second silicon source gas to thereby form a polysilicon layer, the first silicon source gas having a larger molecular weight than a molecular weight of the second silicon source gas;

forming a semiconductor pattern formed of the polysilicon layer on the inner sidewall and the bottom of the first opening and a first insulation layer pattern in the first opening and on the polysilicon layer;

partially etching the sacrificial layer and the insulating interlayer between the semiconductor pattern to form a plurality of sacrificial layer patterns and a plurality of insulating interlayer patterns and a second opening exposing a top surface of the substrate;

removing the sacrificial layer patterns exposed by the second opening, thereby leaving the insulating interlayer patterns remaining on an outer sidewall of the semiconductor pattern spaced apart from one another by a groove formed between each of the spaced apart insulating interlayer patterns;

sequentially forming a tunnel insulation layer, a charge trapping layer and a blocking layer on the outer sidewall of the semiconductor pattern exposed by the second opening and surfaces of the insulating interlayer patterns;

forming a conductive layer on the blocking layer to fill the grooves;

removing a portion of the conductive layer in the second opening such that the conductive layer only remains in the grooves to thereby form a control gate in each of the grooves and removing a portion of the tunnel insulation layer, the charge trapping layer and the blocking layer on a bottom of the second opening to expose an upper surface of the substrate;

forming an impurity region in the exposed upper surface of the substrate;

forming a second insulation layer pattern in the second opening;

forming an upper insulating interlayer on the semiconductor pattern, the first insulation layer pattern, the second insulation layer pattern and an uppermost one of the insulating interlayer patterns; and forming a bit line which is electrically connected to the semiconductor pattern.

17. The method of claim 16, further comprising forming a bit line contact through the upper insulating interlayer to contact a top surface of the semiconductor pattern, prior to forming the bit line, and then forming the bit line on the upper insulating interlayer to contact the bit line contact such that the bit line is electrically connected to the semiconductor pattern via the bit line contact.

18. The method of claim 16, wherein the semiconductor pattern has one of a hollow cylindrical shape or a cup shape and the first insulation layer pattern has one of a solid cylindrical shape or a pillar shape.

19. The method of claim 16, wherein the bit line directly contacts the semiconductor pattern.

20. The method of claim 16, further comprising forming a metal silicide pattern on the impurity region.

* * * * *